United States Patent
Takahashi et al.

(10) Patent No.: US 9,689,763 B2
(45) Date of Patent: *Jun. 27, 2017

(54) MAGNETIC DETECTION DEVICE AND TORQUE SENSOR INCLUDING THE SAME

(71) Applicant: DENSO CORPORATION, Kariya, Aichi-pref. (JP)

(72) Inventors: Yoshiki Takahashi, Kariya (JP); Shigetoshi Fukaya, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/948,061

(22) Filed: Nov. 20, 2015

(65) Prior Publication Data

US 2016/0153850 A1 Jun. 2, 2016

(30) Foreign Application Priority Data

Nov. 27, 2014 (JP) .................................. 2014-239919

(51) Int. Cl.
*G01L 3/10* (2006.01)
*G01R 33/00* (2006.01)
(Continued)

(52) U.S. Cl.
CPC .......... *G01L 3/101* (2013.01); *G01R 33/0047* (2013.01); *G01R 33/07* (2013.01); *G01L 3/00* (2013.01)

(58) Field of Classification Search
CPC ............ G01L 3/105; G01L 3/14; G01L 3/101
See application file for complete search history.

(56) References Cited

U.S. PATENT DOCUMENTS 6,810,336 B2 * 10/2004 Nakane .................. G01L 3/104
702/151
6,847,902 B2 * 1/2005 Fukaya .................... B62D 6/10
702/43
(Continued)

FOREIGN PATENT DOCUMENTS

JP H8-14617 B2 2/1996
JP 2014-149180 A 8/2014
KR 10-2010-0105990 A 10/2010

OTHER PUBLICATIONS

U.S. Appl. No. 14/947,894, Nov. 20, 2015, Takahashi et al.

*Primary Examiner* — Lisa Caputo
*Assistant Examiner* — Tran M Tran
(74) *Attorney, Agent, or Firm* — Knobbe, Martens, Olson & Bear, LLP

(57) ABSTRACT

A cutout portion is formed in a substrate of a magnetic detection device, the cutout portion opening at an outer edge of the substrate. Magnetic detection elements of a magnetic sensor detects magnetic field formed by first and second collector portions. A mold section encapsulates the magnetic detection elements. The magnetic sensor is surface mounted such that a portion of the mold section overlaps with the cutout portion. The first collector portion faces a front surface of the magnetic sensor. A portion of the second collector portion is positioned in the cutout portion to face a rear surface of the magnetic sensor. Accordingly, compared to a case where a cutout portion is not provided, a magnetic circuit gap between the first and second collector portions is reduced.

17 Claims, 25 Drawing Sheets

(51) Int. Cl.
*G01R 33/07* (2006.01)
*G01L 3/00* (2006.01)

(56) References Cited

U.S. PATENT DOCUMENTS

| | | | | |
|---|---|---|---|---|
| 6,868,743 B2* | 3/2005 | Nakane | ................... | G01L 3/104 73/862.331 |
| 6,868,744 B2* | 3/2005 | Sugimura | ............... | G01L 3/104 73/862.333 |
| 6,928,887 B2* | 8/2005 | Nakane | ................... | G01L 3/104 73/862.331 |
| 6,928,888 B2* | 8/2005 | Nakane | ................... | G01L 3/104 73/862.332 |
| 6,988,422 B2* | 1/2006 | Sugimura | ............... | G01L 3/104 73/862.334 |
| 7,047,824 B2* | 5/2006 | Nakane | ................... | B62D 6/10 73/862.331 |
| 7,051,602 B2* | 5/2006 | Nakane | ................... | G01L 3/104 73/862.333 |
| 7,089,809 B2* | 8/2006 | Nakane | ................... | B62D 6/10 73/862.331 |
| 7,110,902 B2* | 9/2006 | Fukaya | ................... | B62D 6/10 702/43 |
| 7,154,262 B2* | 12/2006 | Kamizono | ............. | G01D 5/145 324/207.25 |
| 7,191,669 B2* | 3/2007 | Nakane | ................... | G01L 3/104 73/862.331 |
| 7,227,353 B2* | 6/2007 | Fukaya | .................. | G01D 5/145 324/207.25 |
| 7,246,531 B2* | 7/2007 | Nakane | ................... | G01L 3/104 73/862 |
| 7,285,952 B1* | 10/2007 | Hatanaka | ............... | G01D 5/145 324/207.25 |
| 7,298,395 B2* | 11/2007 | Fukaya | .................. | G01D 5/145 348/149 |
| 7,415,898 B2* | 8/2008 | Ishihara | ................... | B62D 6/10 73/862.331 |
| 7,420,363 B2* | 9/2008 | Hatanaka | ............... | G01D 5/145 324/207.25 |
| 7,568,400 B2* | 8/2009 | Tokumoto | ............... | G01L 5/221 73/862.333 |
| 7,798,019 B2* | 9/2010 | Osuka | ..................... | G01L 3/104 73/862.331 |
| 7,845,244 B2* | 12/2010 | Aoki | ....................... | G01L 5/221 73/862.331 |
| 7,969,147 B2* | 6/2011 | Hatanaka | ............... | G01D 5/145 324/207.25 |
| 8,030,917 B2* | 10/2011 | Hatanaka | ............... | G01D 5/145 324/207.11 |
| 8,203,333 B2* | 6/2012 | Hatanaka | ........... | B62D 15/0215 324/207.25 |
| 8,800,388 B2* | 8/2014 | Takahashi | ............... | G01L 3/104 73/862.331 |
| 8,844,380 B2* | 9/2014 | Takahashi | ............... | G01L 3/104 73/862 |
| 8,915,150 B2* | 12/2014 | Shimomura | ............ | G01L 3/104 73/862 |
| 8,957,678 B2* | 2/2015 | Oota | ....................... | G01L 3/104 324/207.2 |
| 9,024,632 B2* | 5/2015 | Furuichi | ................ | H01L 43/12 324/252 |
| 2007/0247144 A1* | 10/2007 | Tokuhara | ............... | G01D 3/022 324/207.25 |
| 2009/0039880 A1* | 2/2009 | Nomura | ................. | G01R 33/07 324/252 |
| 2009/0128129 A1* | 5/2009 | Aratani | ................ | G01R 15/207 324/117 H |
| 2011/0221432 A1 | 9/2011 | Oota | | |
| 2014/0035445 A1* | 2/2014 | Uryu | ..................... | H02K 11/33 310/68 D |
| 2014/0130612 A1* | 5/2014 | Takahashi | ............... | G01L 3/104 73/862.193 |

* cited by examiner

MAGNETIC DETECTION DEVICE AND TORQUE SENSOR INCLUDING THE SAME

CROSS REFERENCE TO RELATED APPLICATION

The present application is based on Japanese Patent Application No. 2014-239919 filed on Nov. 27, 2014, disclosure of which is incorporated herein by reference.

TECHNICAL FIELD

The present disclosure relates to a magnetic detection device and a torque sensor that includes the magnetic detection device.

BACKGROUND

Conventionally, contactless torque sensors detect torque by detecting changes in magnetic flux density caused by torsional displacement of a torsion bar. For example, JP 2014-149180 A describes a magnetic detection device that includes a support member for supporting a circuit board.

SUMMARY

If a magnetic detector is not surface mounted on a substrate, but instead mounted orthogonal to the substrate surface or the like, there is a concern that detection errors may arise from the magnetic detector tilting. Further, if another member is separately provided to support the magnetic detector on the substrate as disclosed in JP 2014-149180 A, the number of components will increase.

In view of the above, it is an object of the present disclosure to provide a magnetic detection device with improved detection accuracy, and a torque sensor that includes the magnetic detection device.

According to the present disclosure, a magnetic detection device includes a first magnetic collector, a second magnetic collector, a substrate, and a magnetic sensor. The first magnetic collector includes a first collector portion. The second magnetic collector includes a second collector portion, the second collector portion facing the first collector portion from a fixed distance away.

The substrate has an outer edge. A cutout portion is formed in the substrate and opens at the outer edge.

The magnetic sensor includes a magnetic detection element, a mold section, and a terminal, the magnetic sensor being surface mounted such that at least a portion of the mold section overlaps the cutout portion. The magnetic detection element detects a magnetic field formed by the first collector portion and the second collector portion. The mold section encapsulates the magnetic detection element. The terminal protrudes from the mold section and is connected to the substrate.

The first collector portion is positioned to face a front surface of the magnetic sensor, the front surface facing away from the substrate. At least a portion of the second collector portion is positioned in the cutout portion to face a rear surface of the magnetic sensor, the rear surface facing toward the substrate.

According to the present disclosure, the magnetic sensor is surface mounted on the substrate. Accordingly, even without separately providing a member to retain the magnetic sensor, the magnetic sensor may be positioned between the first collector portion and the second collector portion. As a result, the number of components may be reduced.

Further, as compared to a case where the magnetic sensor is not surface mounted, the surface area of the magnetic sensor may be increased. Accordingly, other circuits aside from the magnetic detection element, such as calculation circuits, may be integrally provided in the magnetic sensor.

Further, according to the present disclosure, the cutout portion is formed in the substrate, and the second collector portion is positioned in the cutout portion. Accordingly, as compared to a case where the cutout portion is not provided, a magnetic circuit gap between the first collector portion and the second collector portion may be reduced. Therefore, the amount of magnetic flux leak may be reduced, and detection accuracy is improved.

Further, a torque sensor includes the magnetic detection device, a torsion bar, a multipole magnet, and a magnetic yoke. The torsion bar is coaxially connected to a first shaft and a second shaft, and converts a torque applied between the first shaft and the second shaft into torsional displacement.

The multipole magnet fixed to the first shaft or one end of the torsion bar.

The magnetic yoke is fixed to the second shaft or an other end of the torsion bar. The magnetic yoke forms a magnetic circuit within a magnetic field generated by the multipole magnet.

The first magnetic collector and the second magnetic collector collect magnetic flux from the magnetic yoke at the first collector portion and the second collector portion.

Accordingly, the magnetic detection device may appropriately detect a torque applied between the first shaft and the second shaft.

BRIEF DESCRIPTION OF THE DRAWINGS

The disclosure, together with additional objectives, features and advantages thereof, will be best understood from the following description, the appended claims and the accompanying drawings, in which:

DETAILED DESCRIPTION

Figure 1:
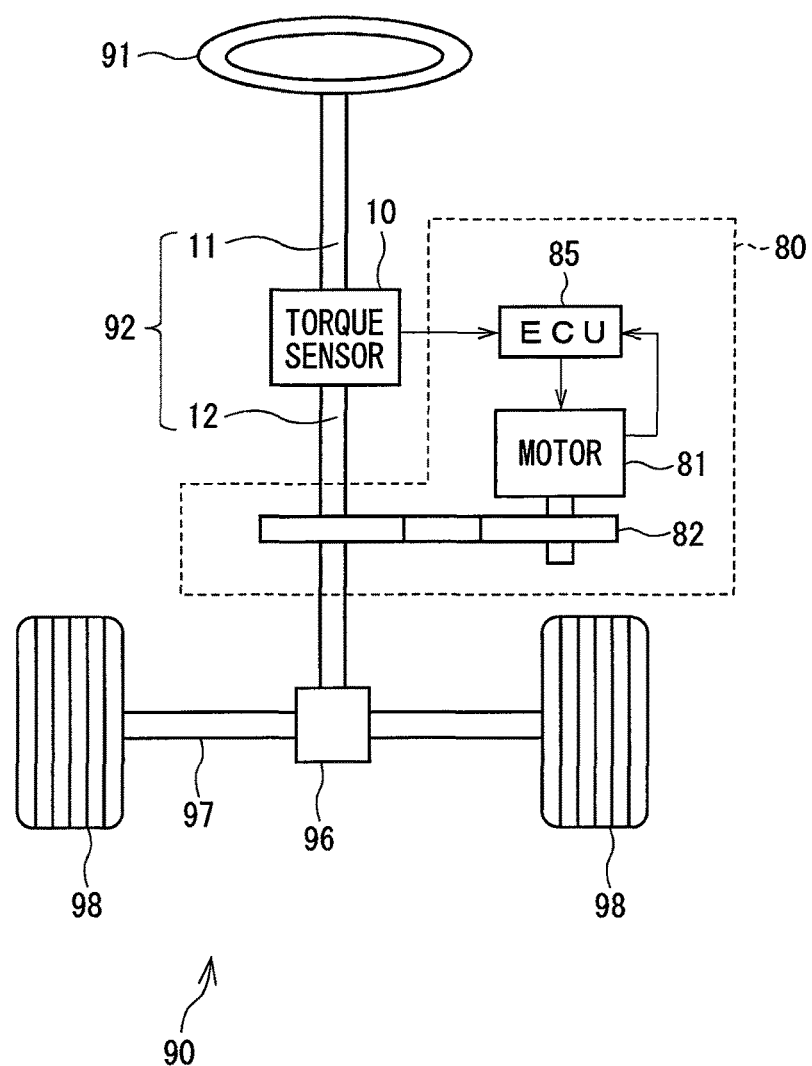
FIG. 1 is a summary outline view showing a steering system including a torque sensor of a first embodiment of the present disclosure.

Hereinafter, a magnetic detection device and a torque sensor including a magnetic detection device according to the present disclosure will be explained with reference to the figures. In the plurality of embodiments, portions which are configured substantially the same are denoted with the same reference numerals, and explanations thereof may be omitted for brevity.

First Embodiment

A first embodiment of the present disclosure is shown in FIGS. 1 to 20. Further, each figure is a schematic view, and the same applies to the figures of the later described embodiments. As shown in FIG. 1, a torque sensor 10 is applied to an electric power steering device 80 that assists a steering operation of, e.g., a vehicle.

FIG. 1 shows the overall configuration of a steering system 90 that includes the electric power steering device 80. Here, a steering shaft 92 is connected to a handle 91.

The steering shaft 92 includes an input shaft 11 that acts as a first shaft and an output shaft 12 that acts as a second shaft. The input shaft 11 is connected to the handle 91. The torque sensor 10, which detects a torque applied to the steering shaft 92, is disposed between the input shaft 11 and the output shaft 12. A pinion gear 96 is disposed at an end of the output shaft 12 away from the input shaft 11. The pinion gear 96 is geared with a rack shaft 97. The two ends of the rack shaft 97 are connected to a pair of wheels 98 through, e.g., tie rods.

Accordingly, when a driver turns the handle 91, the steering shaft 92, which is connected to the handle 91, also rotates. This rotation motion of the steering shaft 92 is converted by the pinion gear 96 into linear motion of the rack shaft 97. Then, the pair of wheels 98 are steered by an angle according to a displacement amount of the rack shaft 97.

The electric power steering device 80 includes a motor 81, a reduction gear 82, and a controller (hereinafter, "ECU") 85. The motor 81 outputs assistance torque that assists the driver in steering the handle 91. In FIG. 1, the motor 81 and the ECU 85 are shown separately, but may be integrated.

The reduction gear 82 reduces and transmits rotation of the motor 81 to the steering shaft 92. In other words, the electric power steering device 80 of the present embodiment is a so-called column assist type device. However, the electric power steering device 80 may be a so-called rack assist type device instead, where rotation of the motor 81 is transmitted to the rack shaft 97.

The ECU 85 obtains the steering torque output by the torque sensor 10, and controls the operation of the motor 81 according the detected steering torque.

Figure 2:
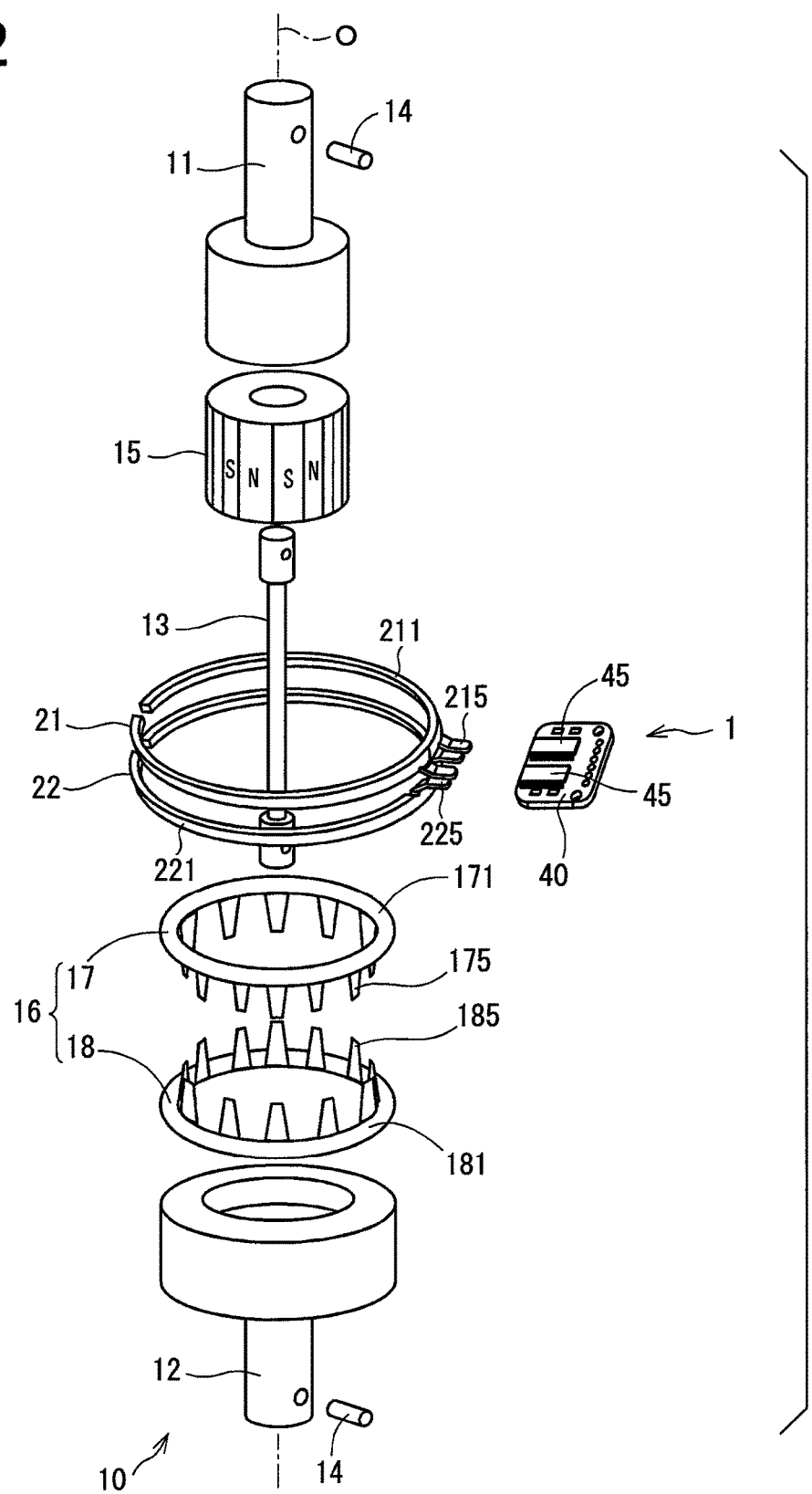
FIG. 2 is an exploded perspective view showing a torque sensor of a first embodiment of the present disclosure.

As shown in FIG. 2, the torque sensor 10 includes a torsion bar 13, a multipole magnet 15, a magnetic yoke 16, and a magnetic detection device 1. In FIG. 2, a yoke retainer 19, a collector ring retainer 25, and a substrate retainer 31, which will be described later, are omitted for simplicity.

One end of the torsion bar 13 is fixed to the input shaft 11 and the other end of the torsion bar 13 is fixed to the output shaft 12 by pins 14. Accordingly, the torsion bar 13 is coaxially connected to the input shaft 11 and the output shaft 11 along an axis of rotation O. The torsion bar 13 is an elastic, rod-shaped member, and converts torque applied to the steering shaft 92 into torsional displacement.

The multipole magnet 15 is formed as a cylinder, and is fixed to the input shaft 11. The multipole magnet 15 is magnetized such that N poles and S poles alternate along a circumferential direction. In the present embodiment, there are twelve pairs of N poles and S poles, for a total of twenty four poles.

Figure 3:
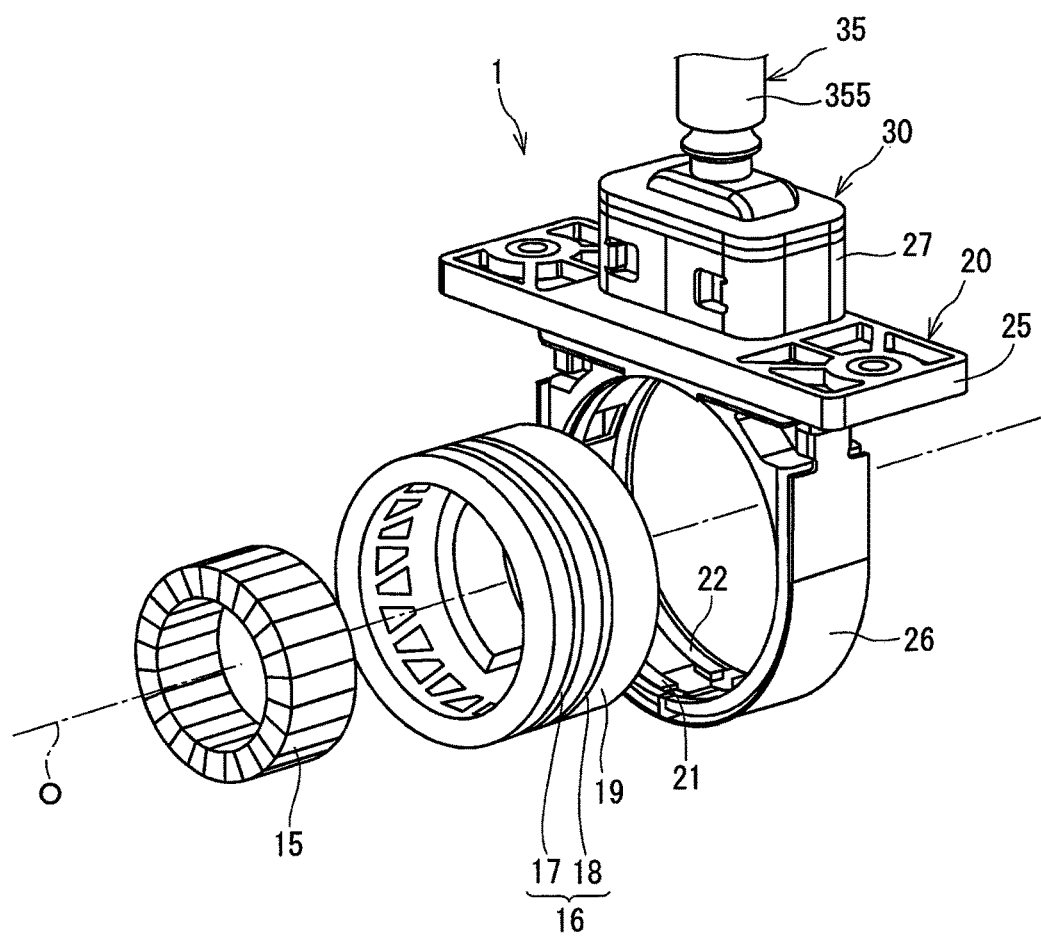
FIG. 3 is an exploded perspective view showing relative positions of a multipole magnet, a magnetic yoke, and magnetic detection device of a first embodiment of the present disclosure.

As shown in FIGS. 2 and 3, the magnetic yoke 16 is retained in the yoke retainer 19, and forms a magnetic circuit within the magnetic field generated by the multipole magnet 15. Here, the yoke retainer 19 is formed from a non-magnetic material such as resin. In the present embodiment, the magnetic yoke 16 is inserted into the yoke retainer 19.

The magnetic yoke 16 includes a first yoke 17 disposed toward the input shaft 11 and a second yoke 18 disposed toward the output shaft 12. The first yoke 17 and the second yoke 18 are both formed from a soft magnetic body in a ring shape, and are fixed to the output shaft 12. The first yoke 17 and the second yoke 18 are disposed radially outward of the multipole magnet 15.

The first yoke 17 includes a ring portion 171 and teeth 175. The teeth 175 are disposed at regular intervals along the entire inner circumferential edge of the ring portion 171. The second yoke 18 includes a ring portion 181 and teeth 185. The teeth 185 are disposed at regular intervals along the entire inner circumferential edge of the ring portion 181.

The number of teeth 175, 185 is equal to the number of pole pairs of the multipole magnet 15 (e.g., twelve in the present embodiment). The teeth 175 and the teeth 185 are offset from each other in the circumferential direction, so that the first yoke 17 and the second yoke 18 face each other across an air gap.

When the torsion bar 13 is under no torsional displacement, i.e., when steering torque is not applied to the steering shaft 92, the centers of the teeth 175, 185 coincide with the boundary between the N poles and S poles of the multipole magnet 15.

As shown in FIGS. 4 to 13, the magnetic detection device 1 includes a magnetic collector unit 20 and a sensor unit 30.

The magnetic collector unit 20 includes a first collector ring 21 that acts as a first magnetic collector, a second collector ring 22 that acts as a second magnetic collector, and the collector ring retainer 25 which acts as a magnetic collector retainer. It should be noted that "collector" used herein refers to magnetic collection.

As shown in FIGS. 2 and 3, the collector rings 21, 22 are positioned radially outward of the magnetic yoke 16, and collect magnetic flux from the magnetic yoke 16. The first collector ring 21 is disposed toward the input shaft 11, and the second collector ring 22 is disposed toward the output shaft 12. The first collector ring 21 and the second collector ring 22 are retained by the collector ring retainer 25 by, e.g., being inserted therein.

Figure 10:
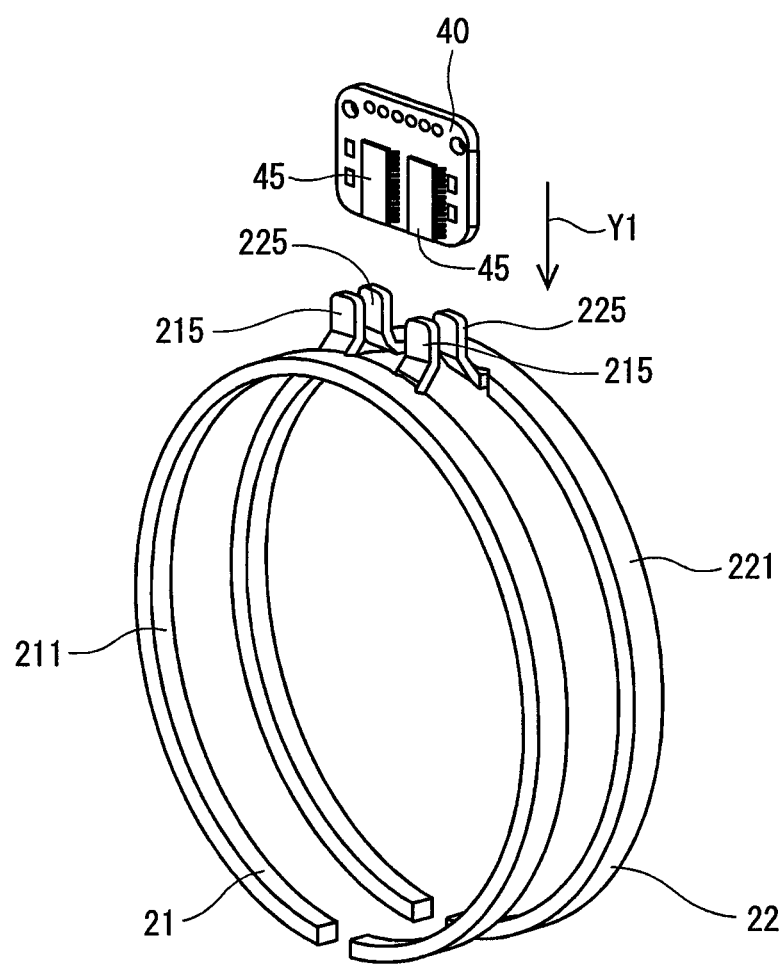
FIG. 10 is a perspective view showing assembly of a collector ring and a substrate of a first embodiment of the present disclosure.

As shown in FIG. 10 and the like, the first collector ring 21 is formed from a soft magnetic body including a substantially ring shaped ring portion 211 and two collector portions 215 that protrude radially outward from the ring portion 211. Similarly, the second collector ring 22 is formed from a soft magnetic body including a substantially ring shaped ring portion 221 and two collector portions 225 that protrude radially outward from the ring portion 221. In the present embodiment, the first collector ring 21 and the second collector ring 22 have substantially the same shape. The collector portions 215 correspond to a "first collector portion", and the collector portions 225 correspond to a "second collector portion".

The opposing surfaces of the collector portions 215 of the first collector ring 21 and the collector portions 225 of the second collector ring 22 are substantially parallel to each other. Magnetic sensors 45, which will be described later, are disposed between the collector portions 215 and the collector portions 225.

As shown in FIGS. 4 to 9, the collector ring retainer 25 is formed from a non-magnetic material such as resin, and includes a ring retainer member 251, a sensor unit housing 255 that acts as a housing, and a mounting portion 258.

Figure 8:
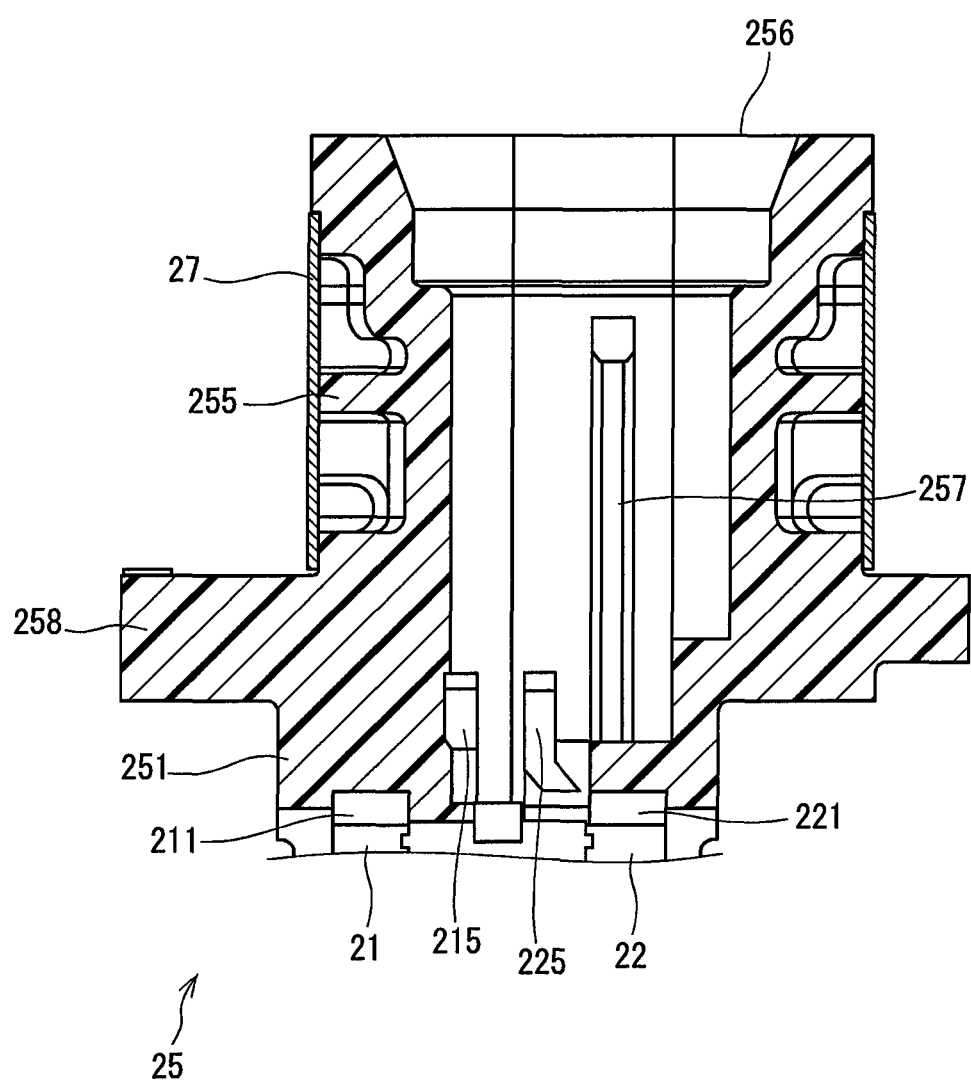
FIG. 8 is a cross-sectional view of a magnetic collector unit of a first embodiment of the present disclosure.

The ring retainer member 251 is substantially circular in shape. The ring portions 211, 221 of the first and second collector rings 21, 22 are embedded on a radially inward side of the ring retainer member 251 such that the collector portions 215 and the collector portions 225 are separated by a predetermined distance. At this time, at least the mutually opposing surfaces of the collector portions 215, 225 are exposed from the collector ring retainer 25. As shown in FIG. 8, the side of the collector portions 215 of the first collector ring 21 facing away from the collector portions 225 is embedded in the ring retainer member 251. Further, the collector portions 225 of the second collector ring 22 protrudes from the ring retainer member 251 such that the collector portions 215 and the collector portions 225 are separated by the predetermined distance. A magnetic shield 26 that blocks external magnetism is disposed on a radially outward side of the ring retainer member 251.

Figure 7:
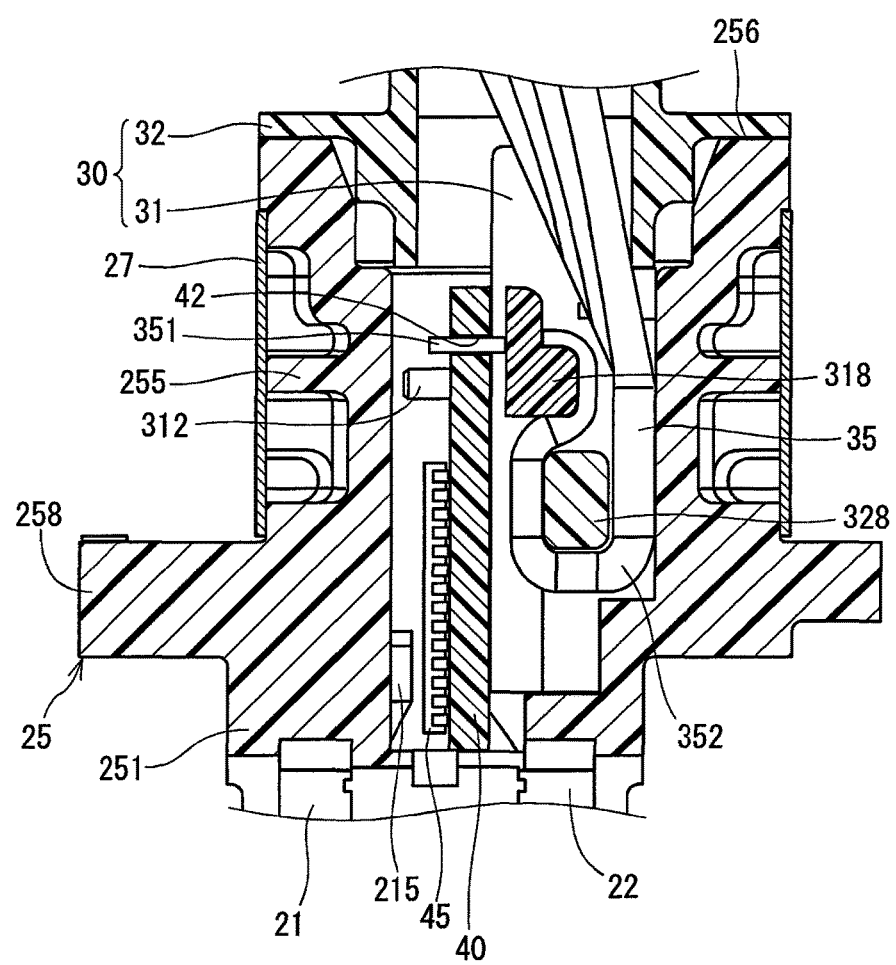
FIG. 7 is a cross-sectional view along the VII-VII line of FIG. 6.
Figure 9:
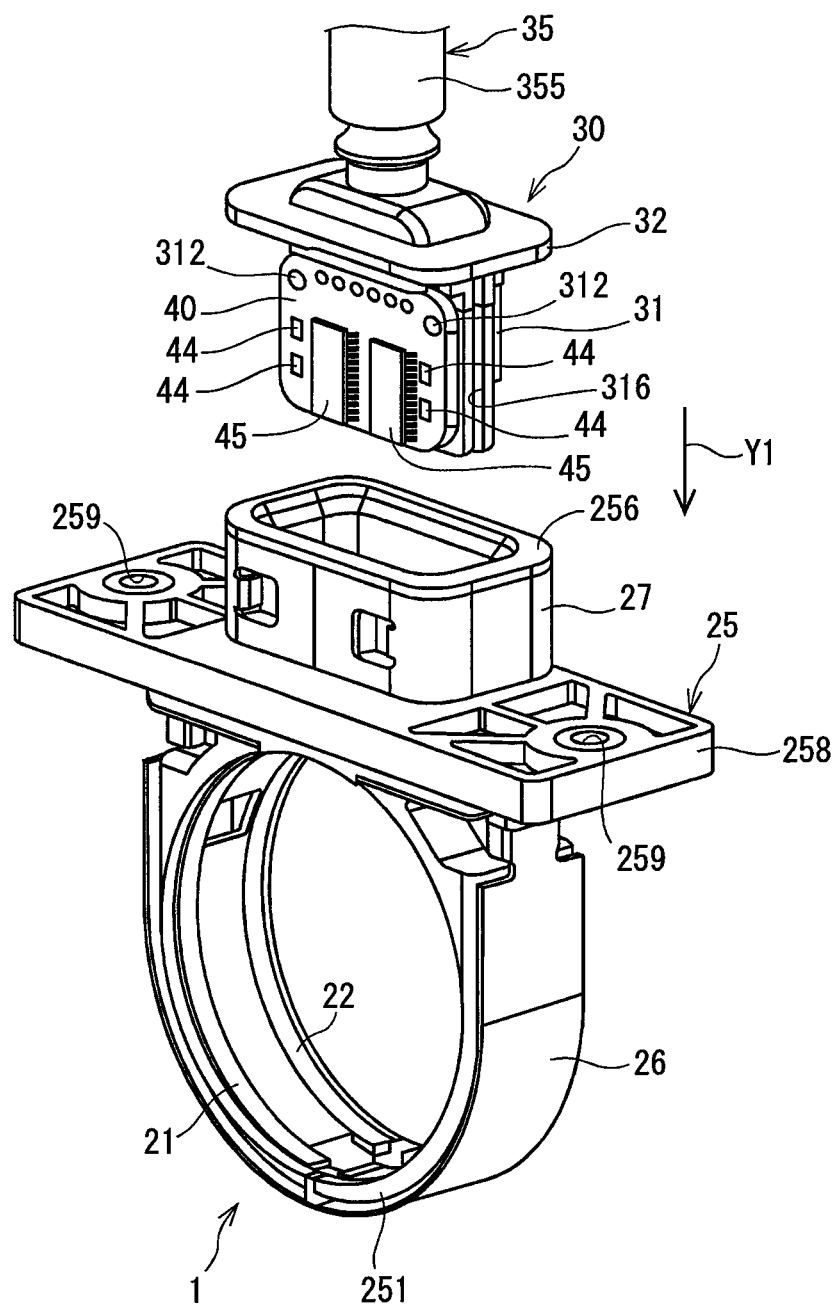
FIG. 9 is a perspective view showing assembly of a magnetic collector unit and a sensor unit of a first embodiment of the present disclosure.

The sensor unit housing 255 houses the sensor unit 30. As shown in FIGS. 7 to 9, an opening 256 is formed in the sensor unit housing 255 on an opposite side from the ring retainer member 251. Further, as shown in FIG. 9, the opening 256 is formed to face the radially outward direction of the collector rings 21, 22.

As shown in FIG. 8, a rib 257 is formed on the inner wall of the sensor unit housing 255. The rib 257 extends along the insertion direction of the sensor unit 30.

Figure 4:
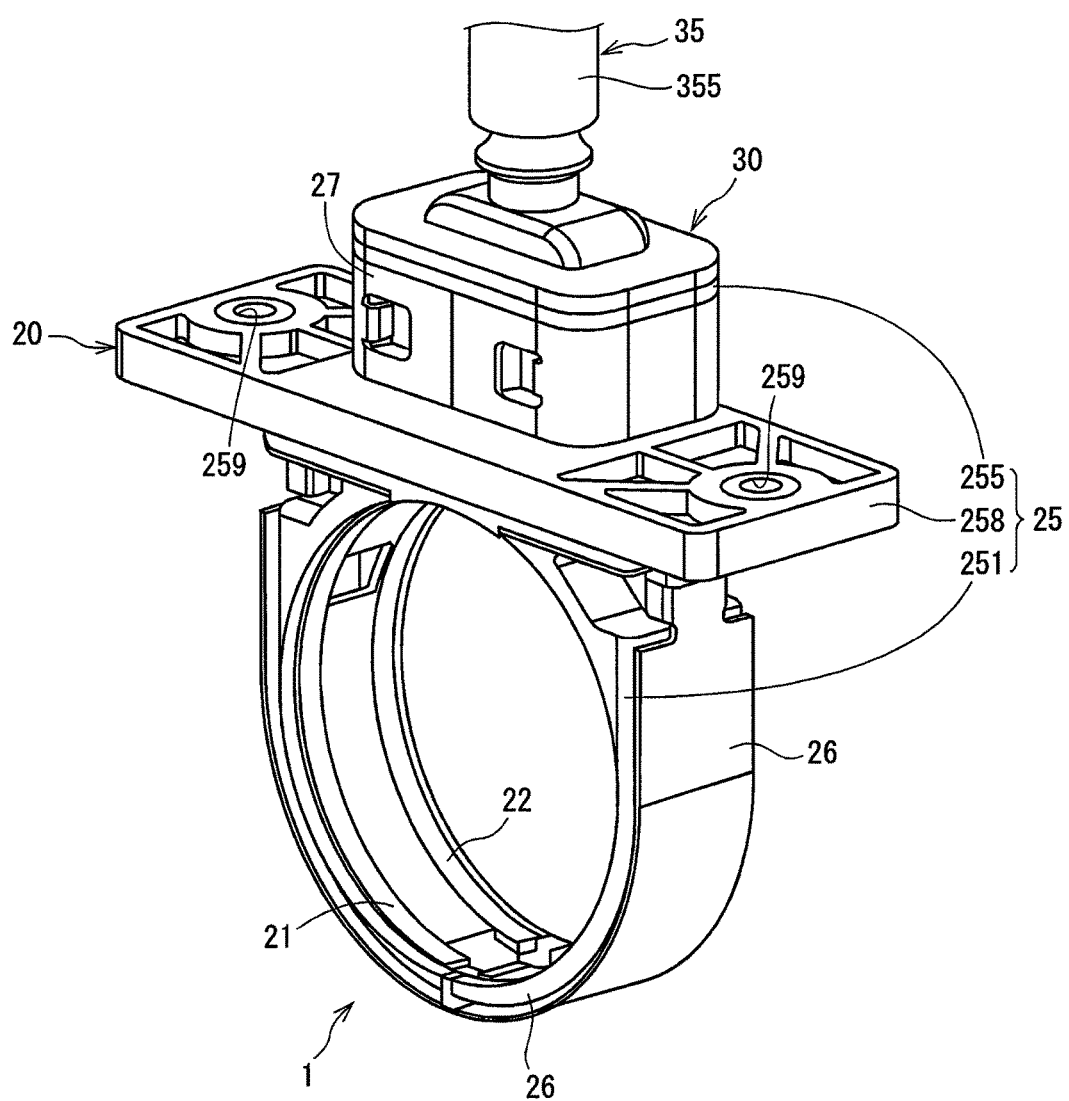
FIG. 4 is a perspective view showing a magnetic detection device of a first embodiment of the present disclosure.
Figure 5:
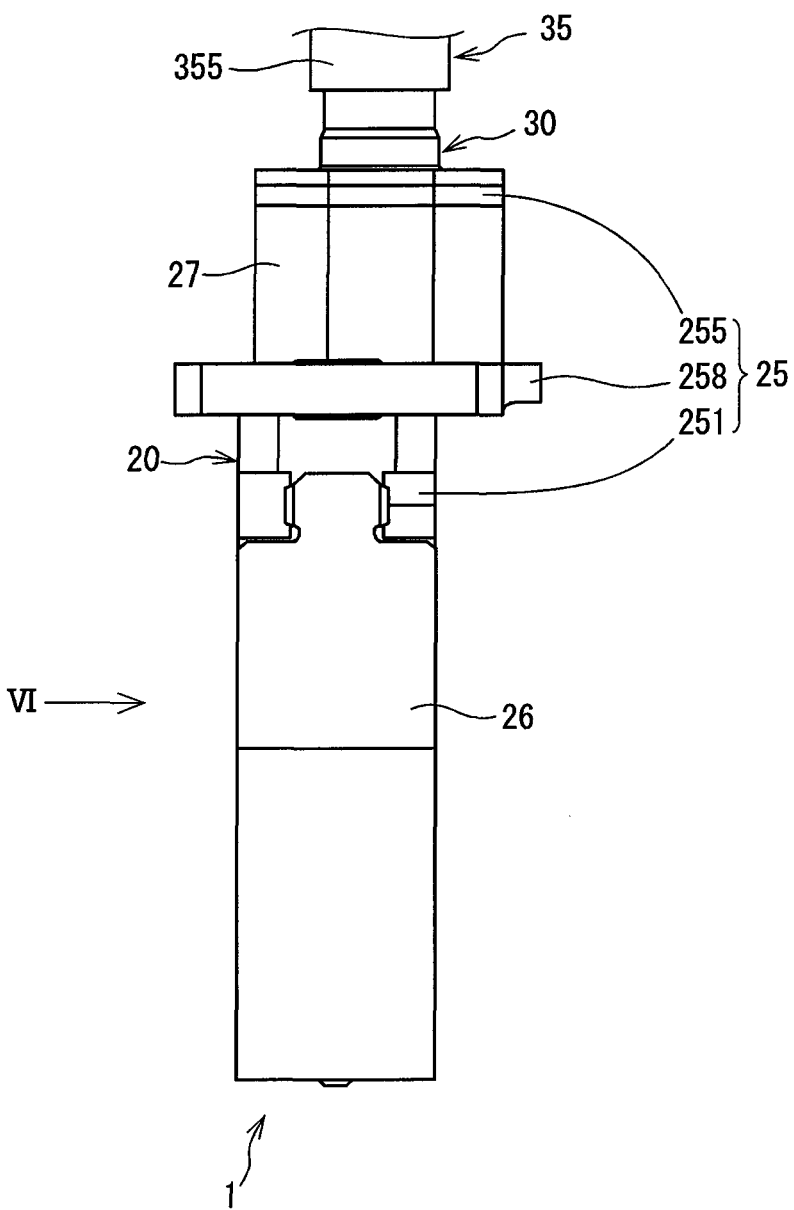
FIG. 5 is a side view showing a magnetic detection device of a first embodiment of the present disclosure.
Figure 6:
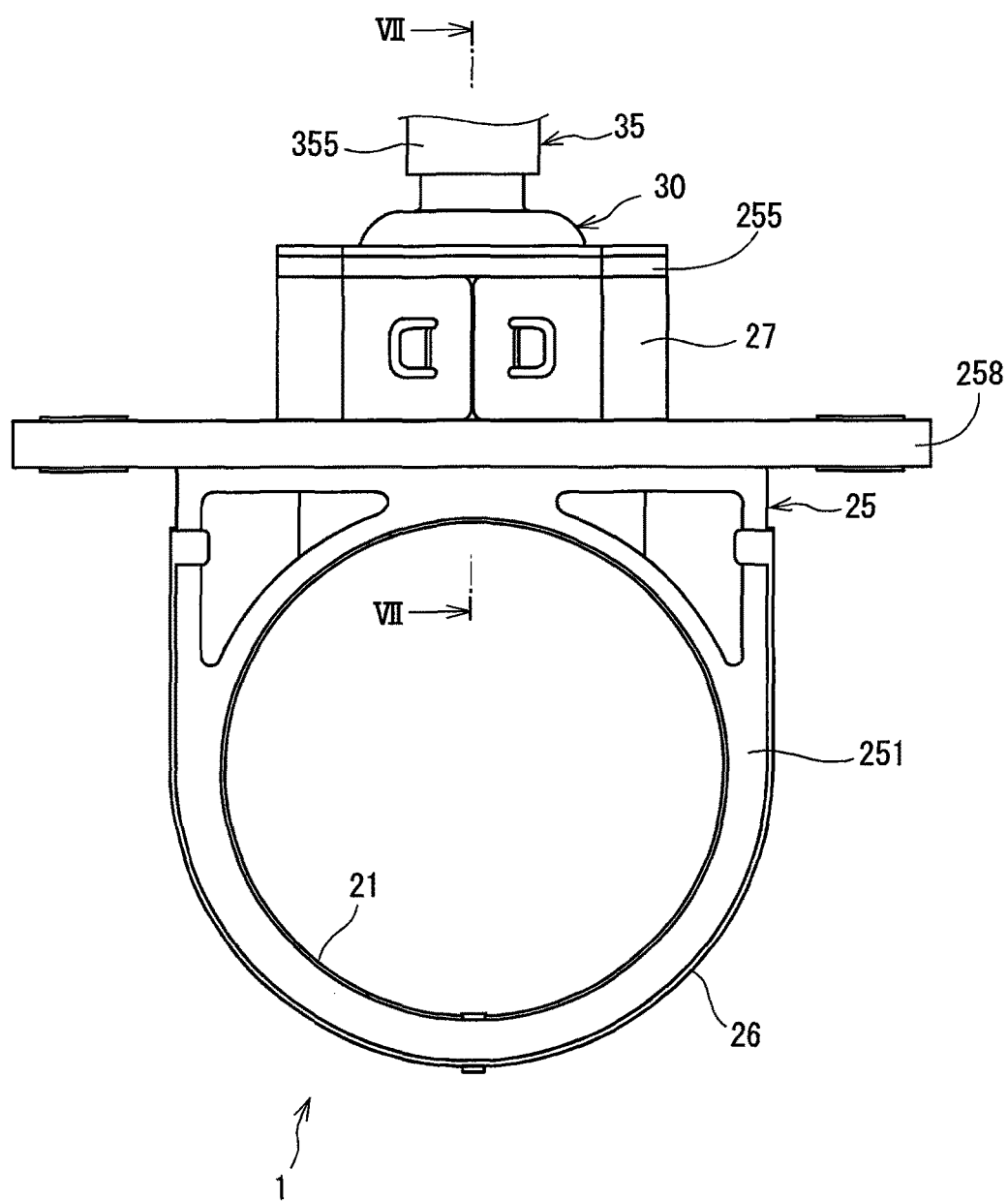
FIG. 6 is a view along the VI direction of FIG. 5.

As shown in FIGS. 4 to 6, a magnetic shield 27 that blocks external magnetism is disposed on the outer peripheral of the sensor unit housing 255.

It should be noted that FIG. 8 is an explanatory view of the magnetic collector unit 20 of FIG. 7.

The mounting portion 258 is disposed between the ring retainer member 251 and the sensor unit housing 255, and extends in a direction tangential to the ring portions 211, 221 of the collector rings 21, 22. Further, opening portions 259 are formed in the mounting portion 258. Screws or the like (not illustrated) are inserted into the opening portions 259 to fix the magnetic detection device 1 to other components such as a cabinet.

Figure 11:
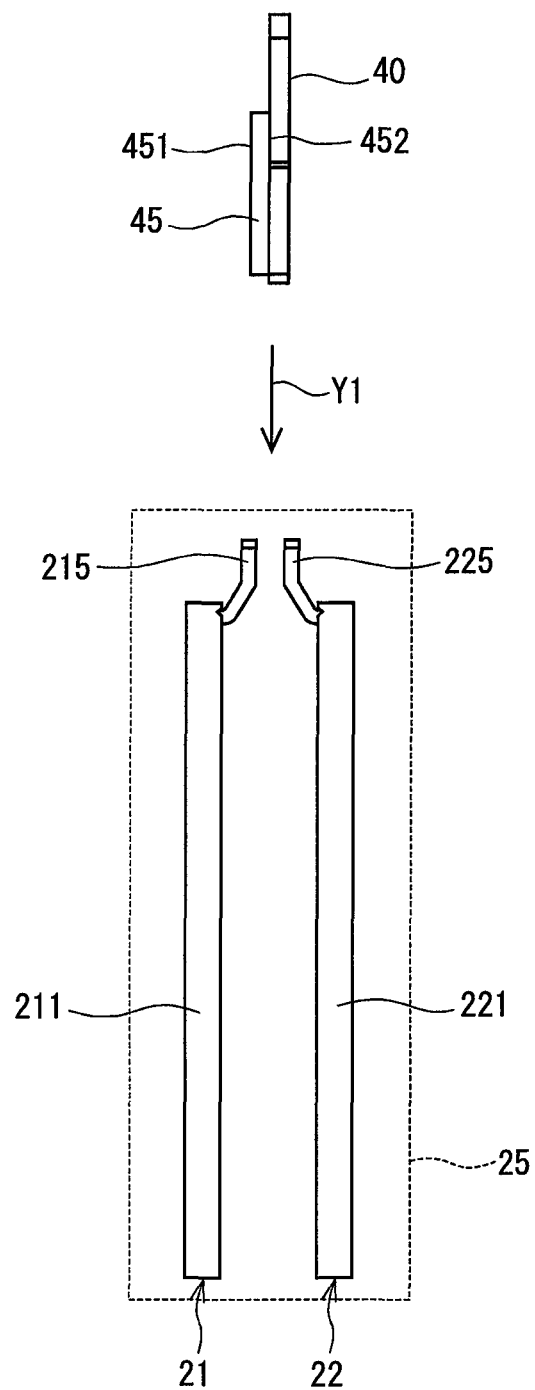
FIG. 11 is a side view that schematically shows a collector ring, a collector ring retainer, and a substrate of a first embodiment of the present disclosure.
Figure 12:
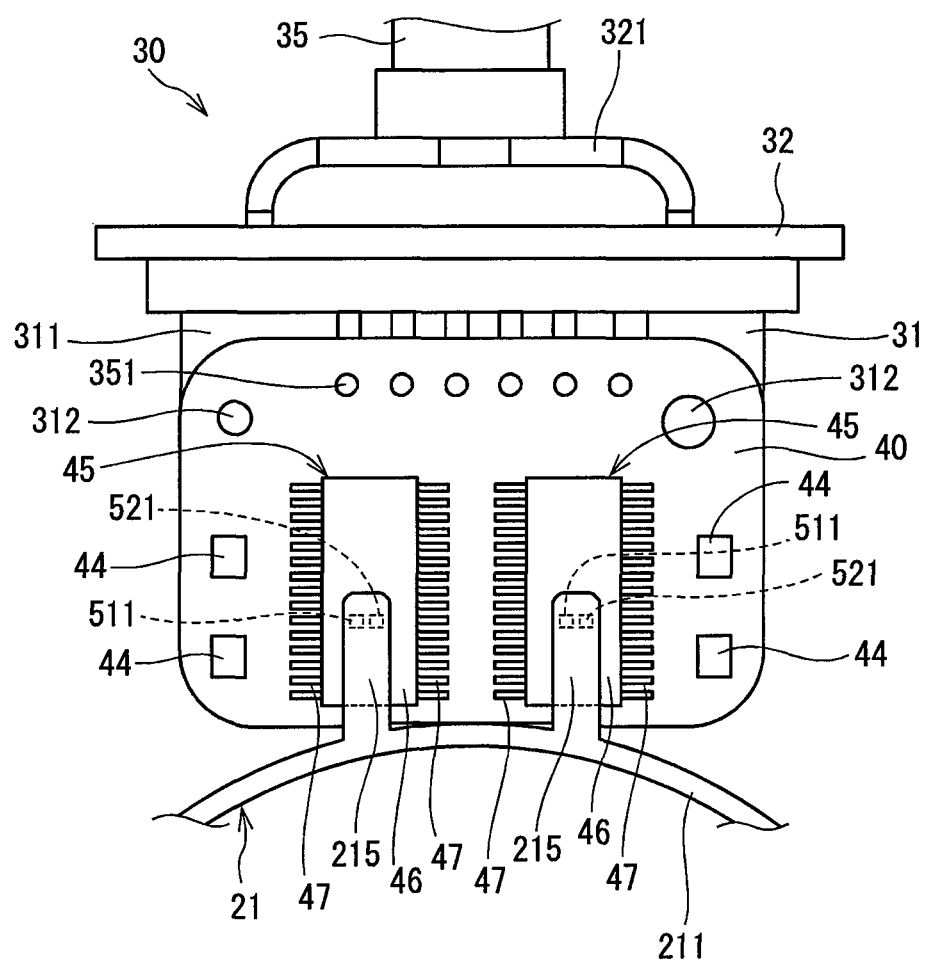
FIG. 12 is a plane view explaining relative positions of a collector portion and a substrate of a first embodiment of the present disclosure.
Figure 13:
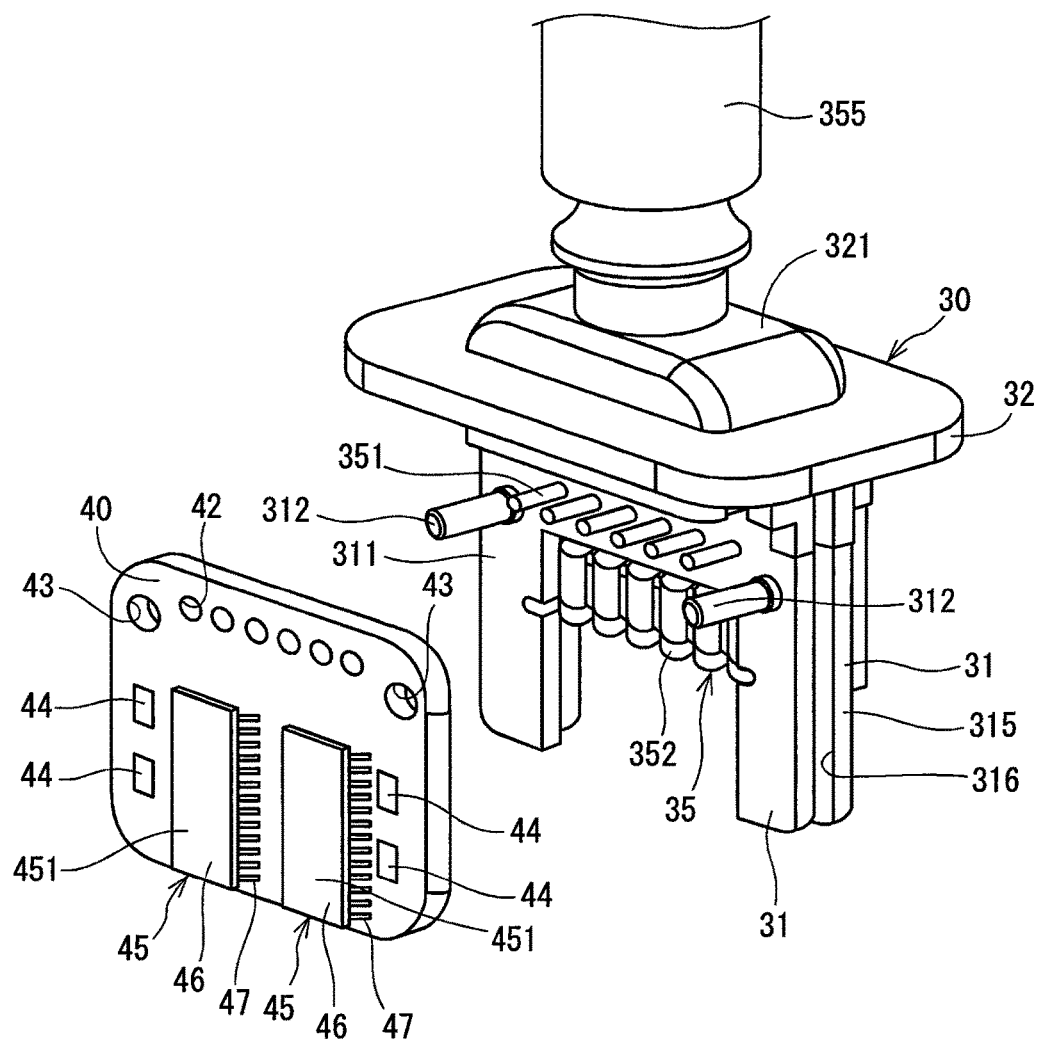
FIG. 13 is an exploded perspective view showing a sensor unit of a first embodiment of the present disclosure.
Figure 14:
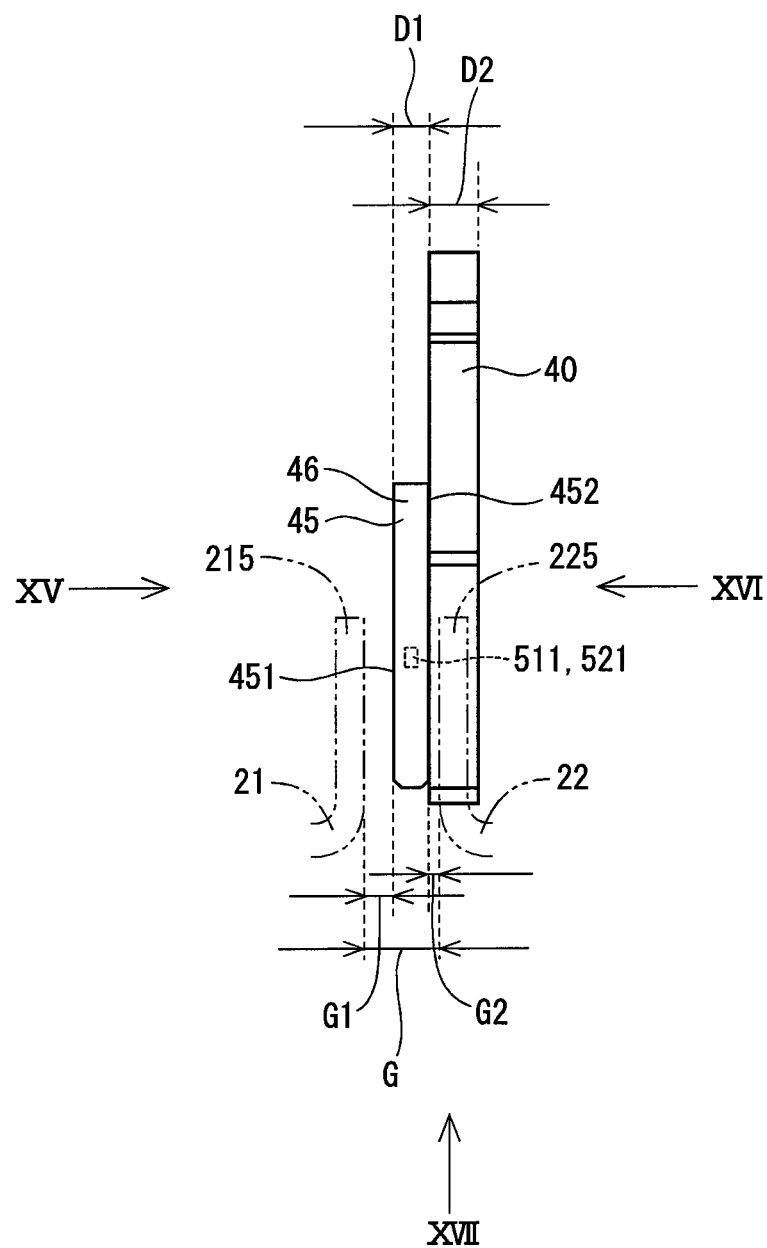
FIG. 14 is a side view showing a substrate and a magnetic sensor of a first embodiment of the present disclosure.

As shown in FIGS. 9, 12, and 13, the sensor unit 30 includes a substrate retainer 31, a cover 32, a wire member 35, a substrate 40, and magnetic sensors 45. As shown by the arrow Y1, the sensor unit 30 is inserted into the sensor unit housing 255 from the opening 256 and is thereby fixed in place. In other words, as shown in FIGS. 10 and 11, the magnetic sensors 45 are inserted between the collector portions 215 and the collector portions 225 from a radially outward direction of the collector rings 21, 22. It should be noted that FIG. 11 is a schematic view of the collector ring retainer 25.

The substrate retainer 31 is formed from a non-magnetic material such as resin. The substrate retainer 31 includes a substrate-mounted surface 311 to which the substrate 40 is fixed. Here, column 312 are formed on the substrate-mounted surface 311. Further, a positioning groove 316 is formed on a side surface 315 of the substrate retainer 31. The rib 257 of the sensor unit housing 255 is inserted into the positioning groove 316, thereby fixing the location of the sensor unit 30 with respect to the sensor unit housing 255.

As shown in FIG. 7, a wire guide 318 is formed in the substrate retainer 31. The wire guide 318 guides the wire member 35 away from the opening 256.

As shown in FIGS. 12 and 13, the cover 32 is formed from a non-magnetic material such as resin, and is formed so as to cover the opening 256 of the sensor unit housing 255. The cover 32 is fixed to the substrate retainer 31 by, e.g., fitting. A wire extraction portion 321 and a wire guide 328 are formed in the cover 32.

As shown in FIGS. 7 and 13, the wire member 35 includes a substrate connector 351, a buffered portion 352, and an assembly portion 355. The substrate connector 351 is inserted into wiring insertion holes 42 of the substrate 40 (see, e.g., FIG. 15).

The buffered portion 352 is hooked around the wire guide 318 and is guided away from the opening 256 of the sensor unit housing 255. Further, the buffered portion 352 is hooked around the wire guide 328, and is extracted from the opening 256. The wire guide 328 is positioned further inward than the substrate connector 351. Accordingly, when the sensor unit 30 is being inserted and a pulling load is applied to the wire guide 328, the pulling load is suppressed from being applied to the connection point between the substrate connector 351 and the substrate 40. As a result, damages to the electrical connection between the wire member 35 and the substrate 40 may be prevented.

A plurality of wire members 35 are gathered at their assembly portions 355 and extracted at the wire extraction portion 321. An end of the wire member 35 opposite from the substrate connector 351 is connected to the ECU 85.

As shown in FIGS. 9 to 19, the substrate 40 is formed as a substantially rectangular flat board. Cutout portions 41 that are open at the outer edge of the substrate 40 are formed in the substrate 40. In the present embodiment, the cutout portions 41 are open at an outer edge 401 of the substrate 40, the outer edge 401 being the leading edge of the substrate 40 when the substrate 40 is being inserted into the magnetic collector unit 20. Further, the cutout portions 41 are formed according to the number of magnetic sensors 45. In the present embodiment, two substantially rectangular cutout portions 41 are formed.

Further, the wire insertion holes 42 and fixing holes 43 are formed in the substrate 40. The substrate connector 351 of the wire member 35 is inserted into the wire insertion holes 42, and is electrically connected thereto by, e.g., soldering. Further, the column 312 of the substrate retainer 31 are inserted into the fixing holes 43 and are fixed thereto by, e.g., thermal caulking. As a result, the substrate 40 is fixed to the substrate retainer 31.

Chip capacitors 44 and the magnetic sensors 45 are surface mounted on the substrate 40. The chip capacitors 44 are used for, e.g., removing noise.

The magnetic sensors 45 include a mold section 46 and terminals 47, the mold section 46 encapsulating a circuit unit 50 which will be described later. The magnetic sensors 45 are surface mounted on the substrate 40 at locations where the cutout portions 41 are formed. Specifically, the magnetic sensors 45 are mounted to the substrate 40 such that at least a portion of each mold section 46 overlaps each cutout portion 41. Since the magnetic sensors 45 are surface mounted to the substrate 40, a component for retaining the magnetic sensors 45 is not provided. As such, the magnetic sensors 45 may be disposed at any desired location between the collector portions 215, 225. Further, by surface mounting the magnetic sensors 45, the chip surface area of the magnetic sensors 45 may be increased, and other circuit components aside from magnetic detection elements 511, 521 (which are described later) may be integrally provided in the magnetic sensors 45.

Figure 17:
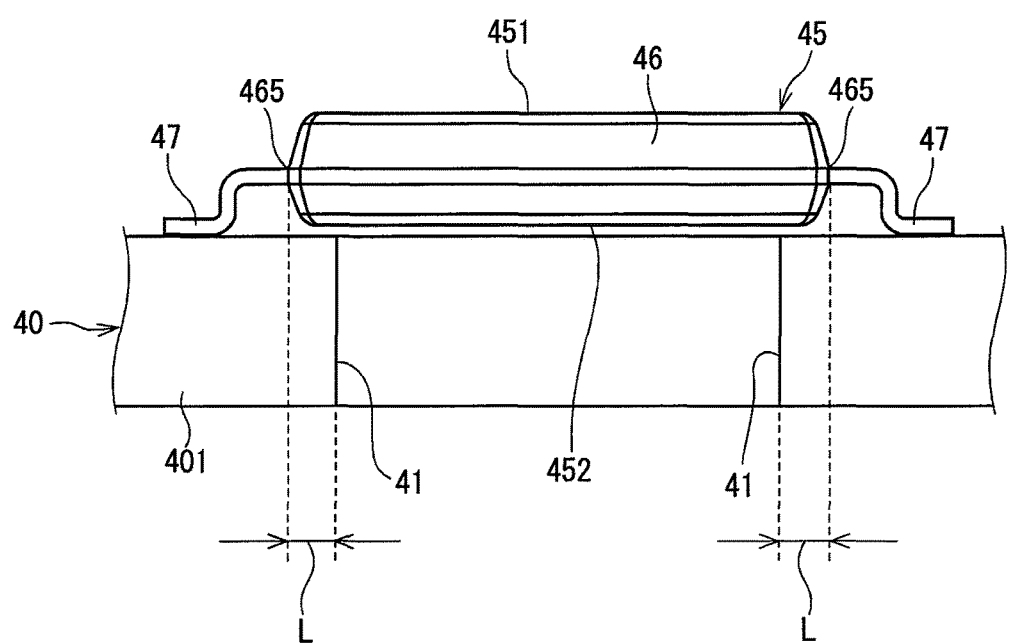
FIG. 17 is a view along the XVII direction of FIG. 14.
Figure 18:
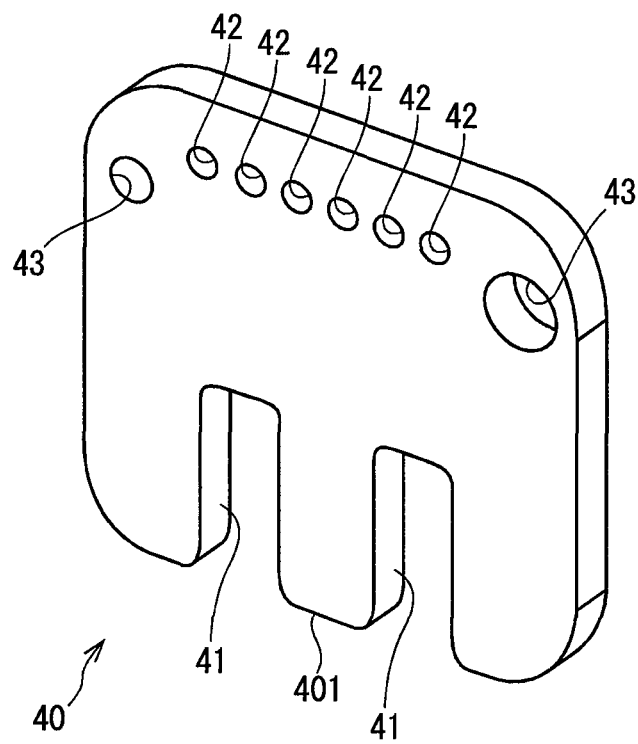
FIG. 18 is a perspective view of a substrate of a first embodiment of the present disclosure.
Figure 19:
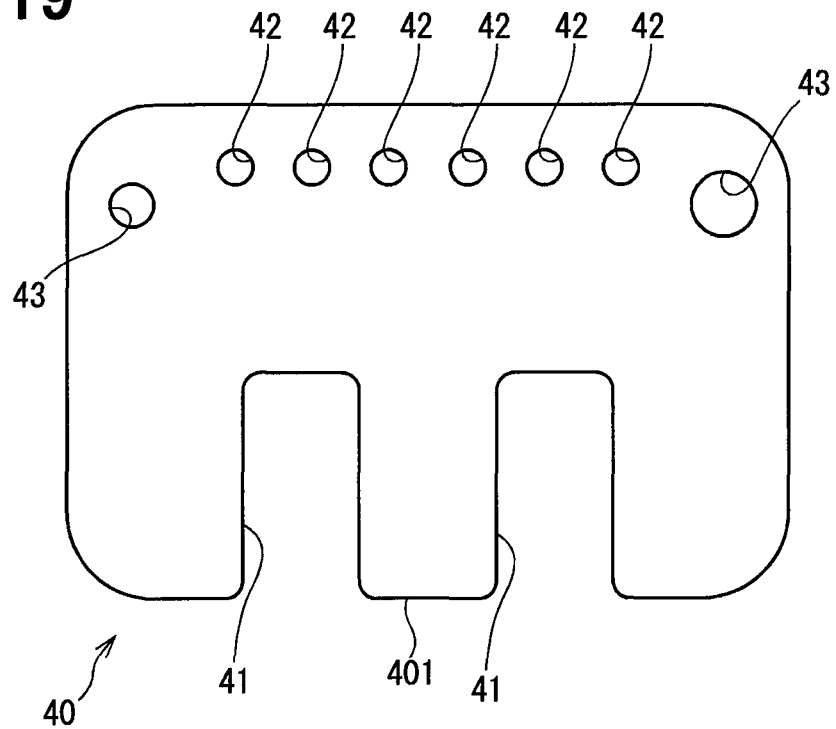
FIG. 19 is a plane view of a substrate of a first embodiment of the present disclosure.

The surface of the mold section 46 is substantially rectangular. As shown in FIG. 17, the width of the mold section 46 (i.e., in FIG. 17, a length in the left-right direction) is greater than the width of the cutout portions 41. In other words, an edge 465 of the mold section 46 toward the terminals 47 is positioned outward of the cutout portions 41 by a length L.

The terminals 47 protrude from the lengthwise sides of the mold section 46, and are electrically connected to the substrate 40 by, e.g., soldering. In the present embodiment, the width of the mold section 46 is larger than the width of the cutout portions 41 to ensure a soldering space for connecting the terminals 47 to the substrate 40, thereby improving the reliability of this connection.

It should be noted that FIG. 17 is a perspective view in the XVII direction of FIG. 13, rotated clockwise by 90°. Further, FIG. 17 only shows the area corresponding to one of the magnetic sensors 45, and other portions are omitted for simplicity.

As shown in FIGS. 12 and 14 to 16, the magnetic sensors 45 include a front surface 451 that faces away from the substrate 40, and a rear surface 452 that faces toward the substrate 40. The collector portions 215 of the first collector ring 21 are positioned so as to face the front surface 451. A gap G1 (see FIG. 14) is formed between the front surface 451 and the collector portions 215 to prevent contact.

Further, the collector portions 225 of the second collector ring 22 are inserted into the cutout portions 41. A gap G2 (see FIG. 14) is formed between the rear surface 452 and the collector portions 225 to prevent contact. Further, the gaps G1 and G2 may be equal, or may be different.

Figure 28:
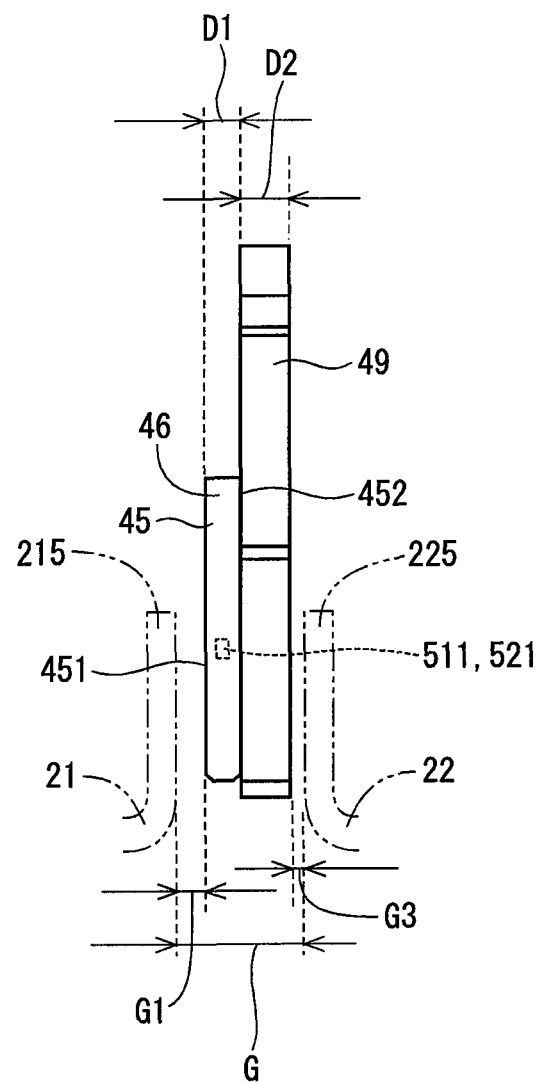
FIG. 28 is a side view showing a substrate and a magnetic sensor of a reference example of the present disclosure.

FIG. 28 shows a reference example where the cutout portions 41 are not formed in a substrate 49. In this case, a gap G3 must be formed between the substrate 49 and the collector portions 225 to prevent contact. Here, the thickness of the magnetic sensors 45 is defined as D1 and the thickness of the substrate 49 is defined as D2. Thus, a magnetic circuit gap G between the collector portions 215 and 225 is D1+D2+G1+G3. As compared to when magnetic sensors are not surface mounted, the magnetic circuit gap G is greater by the thickness D2 of the substrate 49, and thus the amount of leaked magnetic flux increases.

In contrast, in the present embodiment, the cutout portions 41 are formed in the substrate 40 and the collector portions 225 are inserted into the cutout portions 41. Accordingly, the magnetic circuit gap G is D1+G1+G2. In other words, by positioning the collector portions 225 in the cutout portions 41, the magnetic circuit gap G is smaller than the reference example of FIG. 28 by the thickness D2 of the substrate 40. Therefore, a magnetic circuit similar to when magnetic sensors are not surface mounted may be formed.

Figure 20:
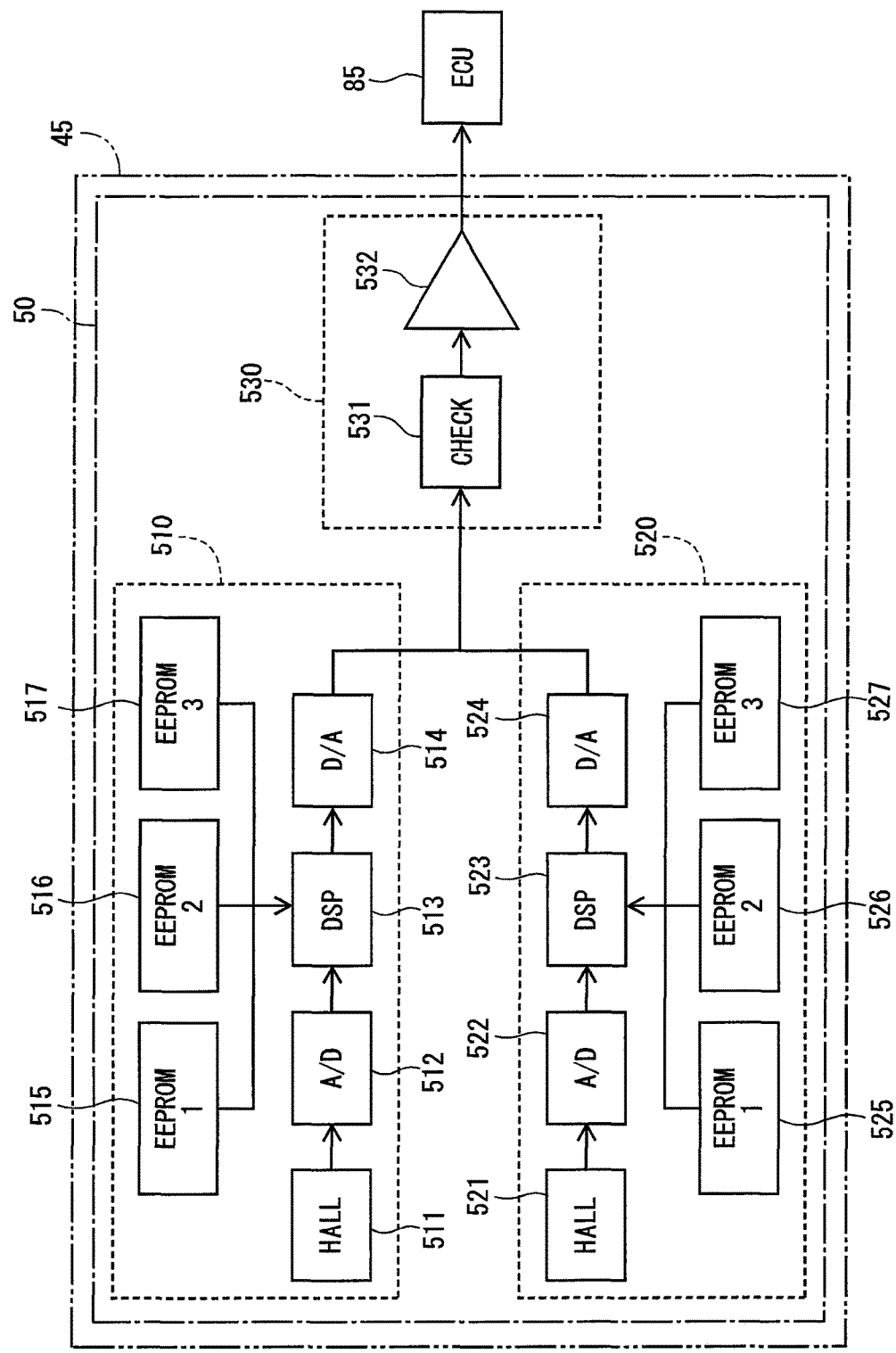
FIG. 20 is a block diagram explaining a configuration of a magnetic sensor of a first embodiment of the present disclosure.

As shown in FIG. 20, the magnetic sensors 45 each include a circuit unit 50.

The circuit unit 50 includes a first circuit 510, a second circuit 520, and a check circuit 530.

The first circuit 510 includes a magnetic detection element 511 (shown as "Hall" in the figures), an A/D converter 512, a processor 513 (shown as "DSP" in the figures), a D/A converter 514, and three memory units 515, 516, 517 (shown as "EEPROM" 1 to 3 in the figures).

The second circuit 520 includes a magnetic detection element 521, an A/D converter 522, a processor 523, a D/A converter 524, and three memory units 525, 526, 527.

In the present embodiment, the first circuit 510 is for output purposes, and the second circuit 520 is for comparison purposes. It should be noted that corresponding elements between the first circuit 510 and the second circuit 520, i.e., elements denoted with reference numerals which end in the same number, have substantially the same configuration. Accordingly, the following explanation will be provided with respect to the first circuit 510, and explanations of the second circuit 520 will be omitted for brevity where appropriate.

Figure 15:
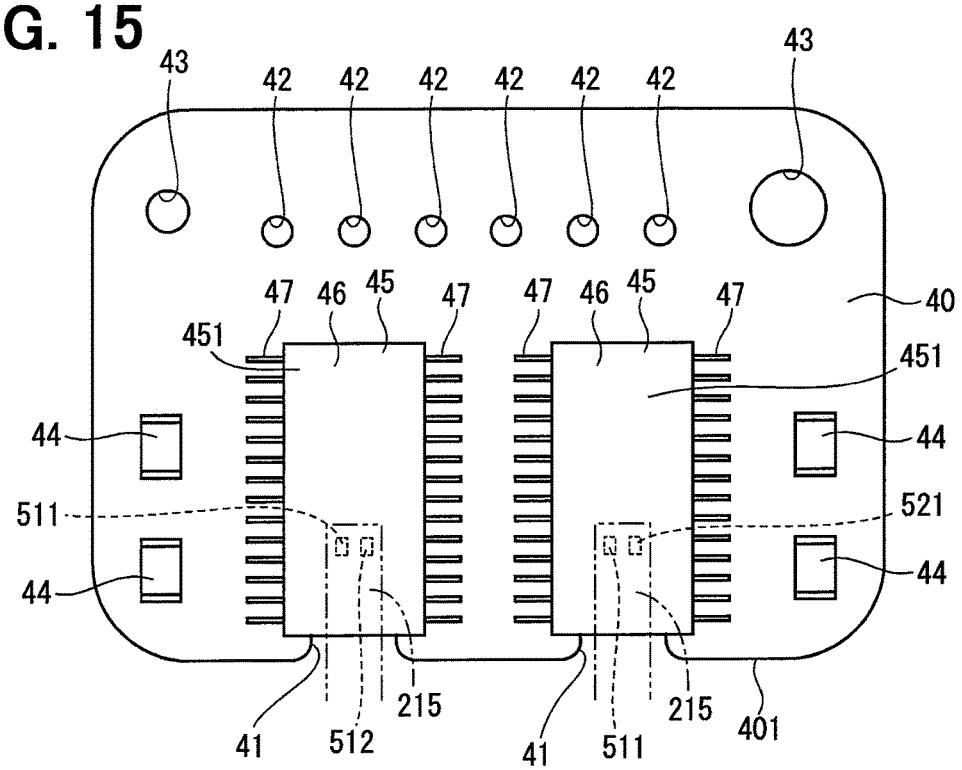
FIG. 15 is a view along the XV direction of FIG. 14.
Figure 16:
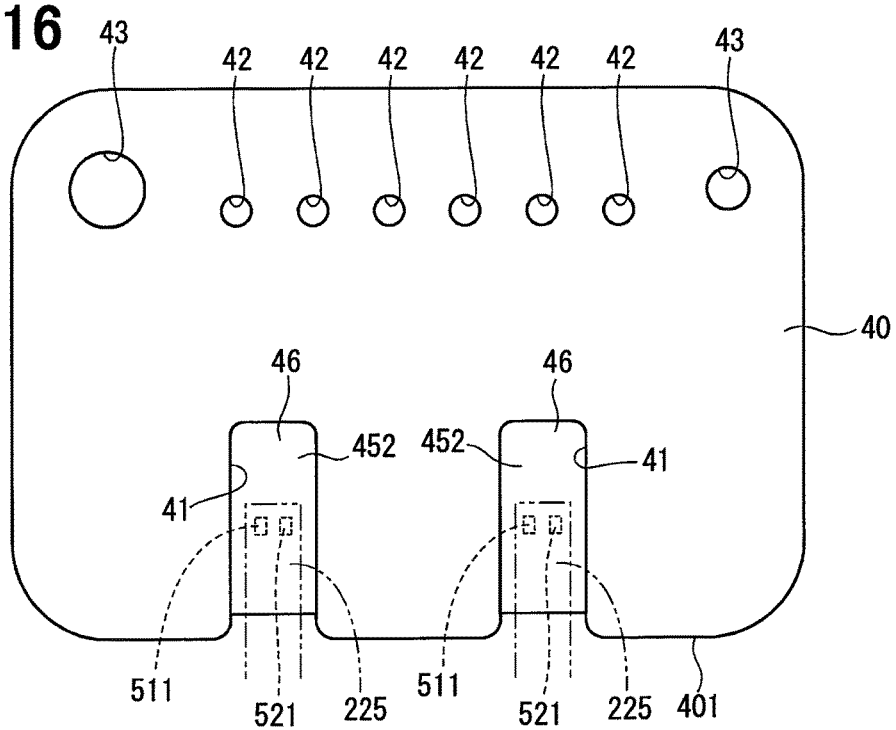
FIG. 16 is a view along the XVI direction of FIG. 14.

The magnetic detection element 511 is a Hall element and detects magnetic flux between the collector portions 215 and the collector portions 225. As shown in FIGS. 12, 15, and 16, when viewed from the front surface 451, the magnetic detection elements 511, 521 are positioned in the same location as the collector portions 215, 225. Accordingly, the magnetic flux between the collector portions 215 and the collector portions 225 may be appropriately detected.

Hereinafter, detection of steering torque with the magnetic detection element 511 will be explained.

In the present embodiment, the magnetic detection elements 511, 521 are positioned between the collector portions 215 and the collector portions 225. When a steering torque is not applied between the input shaft 11 and the output shaft 12, the centers of the teeth 175 of the first yoke 17 and the teeth 185 of the second yoke 18 are positioned so as to coincide with the boundary between the N poles and S poles of the multipole magnet 15. At this time, since the same number of magnetic field lines of the N poles and S poles of the multipole magnet 15 are entering and exiting the teeth 175, 185, each of the magnetic field lines form a closed loop within the first yoke 17 and the second yoke 18. As a result, there is no magnetic flux leak between the yokes 17, 18, and thus the magnetic flux density detected by the magnetic detection element 511 is zero.

When a steering torque is applied between the input shaft 11 and the output shaft 12 and torsional displacement occurs in the torsion bar 13, the multipole magnet 15, which is fixed to the input shaft 11, is displaced in the circumferential direction relative to the yokes 17, 18, which are fixed to the output shaft 12. As a result, the magnetic flux density passing through the magnetic detection element 511 is substantially proportional the amount of torsional displacement in the torsion bar 13, and also switches polarity according to the twisting direction of the torsion bar 13. Specifically, the magnetic detection element 511 detects the strength of the magnetic field passing through the thickness direction of the magnetic sensors 45, i.e., in a direction orthogonal to the surfaces of the collector portions 215, 225 (in FIG. 14, the left-right direction). The magnetic detection element 511 outputs the strength of the detected magnetic field as a voltage signal to the A/D converter 512.

The A/D converter 512 converts the voltage signal output by the magnetic detection element 511 from analog to digital, then outputs the digital signal to the processor 513.

The processor 513 is a computer such as a digital signal processor. The processor 513 calculates a torque generated in the input shaft 11 and the output shaft 12 using information stored in the memory units 515, 516, 517 as well as using the signal input from the A/D converter 512.

The D/A converter 514 converts the calculation results of the processor 513 from digital to analog, then outputs the analog signal to the check circuit 530.

The memory units 515, 516, 517 are non-volatile memory such as EEPROM. The memory units 515, 516, 517 store various parameters for, e.g., temperature correction of the magnetic detection element 511. Typically, the memory units 515, 516, 517 each store the same data.

In the present embodiment, the three memory units 515, 516, 517 are provided for the one magnetic detection element 511 in order to provide storage redundancy. Specifically, the processor 513 reads data from all three of the memory units 515, 516, 517 and compares the data. Then, the processor 513 chooses a parameter based on majority rule, thus ensuring redundancy in the parameters of the memory units 515, 516, 517. For example, if the processor 513 reads a parameter P1 from the memory unit 515, a parameter P2 from the memory unit 516, and a parameter P3 from the memory unit 517, and determines that P1≠P2=P3, then the processor 513 will determine that P1 is abnormal and perform the calculation using P2 and P3.

The check circuit 530 includes a determination unit 531 and an output unit 532.

The determination unit 531 performs an abnormality determination for a first calculation result E1 output from the first circuit 510 and a second calculation result E2 output from the second circuit 520.

The output unit 532 outputs an output signal according to the determination result of the determination unit 531 to the ECU 85. If the first calculation result E1 is normal, then the output unit 532 outputs the first calculation result E1. If it is determined that one of the first calculation result E1 and the second calculation result E2 is normal, and the other is abnormal, then the output unit 532 outputs a signal according to the normal one of the first calculation result E1 and the second calculation result E2 to the ECU 85.

Further, if both the first calculation result E1 and the second calculation result E2 are determined to be abnormal, the output unit 532 outputs a voltage signal indicating that a normal signal is not output from the magnetic sensors 45 to the ECU 85. As a result, an abnormality may be determined to have occurred in the magnetic sensors 45 themselves, and this abnormality may be notified to the ECU 85.

As explained above, the magnetic detection device 1 according to the first embodiment of the present disclosure includes the first collector ring 21, the second collector ring 22, the substrate 40, and the magnetic sensors 45.

The first collector ring 21 includes the collector portions 215.

The second collector ring 22 includes the collector portions 225, the collector portions 225 facing the collector portions 215 from a fixed distance away.

The cutout portions 41 are formed in the substrate 40 and open at the outer edge 401 of the substrate 40.

The magnetic sensors 45 include the magnetic detection elements 511, 521, the mold section 46, and the terminals 47. The magnetic detection elements 511, 521 detect a magnetic field formed by the collector portions 215 and the collector portions 225. The mold section 46 encapsulates the magnetic detection elements 511, 521. The terminals 47 protrude from the mold section 46 and are connected to the substrate 40. The magnetic sensors 45 are surface mounted such that at least a portion of the mold section 46 overlaps the cutout portions 41.

The collector portions 215 are positioned to face the front surface 451 of the magnetic sensors 45, the front surface 451 facing away from the substrate 40. At least a portion of the collector portions 225 are positioned in the cutout portions 41 to face the rear surface 452 of the magnetic sensors 45, the rear surface 452 facing toward the substrate 40.

In the present embodiment, the magnetic sensors 45 are surface mounted on the substrate 40. Thus, even without separately providing a component for retaining the magnetic sensors 45, the magnetic sensors 45 may be positioned between the collector portions 215 and the collector portions 225. As a result, the number of components may be reduced. Further, as compared to a case where the magnetic sensors 45 are not surface mounted on the substrate 40, the element surface area of the magnetic sensors 45 may be increased. As such, other circuits aside from the magnetic detection elements 511 and 521, such as calculation circuits, may be integrally provided.

Further, in the present embodiment, the cutout portions 41 are formed in the substrate 40, and the collector portions 225 are positioned in the cutout portions 41. As a result, as compared to a case where the cutout portions 41 are not provided, the magnetic circuit gap G between the collector portions 215 and the collector portions 225 may be reduced. Therefore, the amount of magnetic flux leak may be reduced, and detection accuracy is improved.

When viewed from the front surface 451 or the rear surface 452, the magnetic detection elements 511, 521 are positioned in an area overlapping with the collector portions 215, 225. Accordingly, the strength of the magnetic field of the collector portions 215, 225 may be appropriately detected.

In other words, the collector portions 215, 225 do not need to overlap in areas where the magnetic detection elements 511, 521 of the magnetic sensors 45 are not provided.

The terminals 47 protrude from the edge 465 of the mold section 46, and the edge 465 is positioned outward of the cutout portions 41.

As a result, if for example the terminals 47 are connected to the substrate 40 by a bonding material such as solder, a space for this bonding material may be ensured, and the connection between the substrate 40 and the magnetic sensors 45 may be improved.

The magnetic detection device 1 further includes the collector ring retainer 25 that retains the first collector ring 21 and the second collector ring 22. In the present embodiment, the collector ring retainer 25 integrally retains the first collector ring 21 and the second collector ring 22. As a result, as compared to a case where components for retaining the first collector ring 21 and the second collector ring 22 are separately provided, the number of components may be reduced.

The magnetic detection device 1 further includes the substrate retainer 31 that retains the substrate 40.

The collector ring retainer 25 includes the sensor unit housing 255 that house the substrate retainer 31. Further, the sensor unit housing 255 is disposed outside (in the present embodiment, radially outward) of the first collector ring 21 and the second collector ring 22. The sensor unit housing 255 includes the opening 256, the opening 256 being formed to open away from the first collector ring 21 and the second collector ring 22.

The substrate retainer 31 is inserted into the sensor unit housing 255 from the opening 256.

Accordingly, the substrate retainer 31, to which the substrate 40 is fixed, may be appropriately assembled with the collector ring retainer 25.

The magnetic detection device 1 further includes the wire member 35. The wire member 35 includes the substrate connector 351 connected to the substrate 40, and connects the substrate 40 to another device (in the present embodiment, the ECU 85).

The wire member 35 is hooked around a wire guide 328 positioned farther away from the opening 256 than the substrate connector 351 is from the opening 259. The end of the wire member 35 opposite from the substrate connector 351 is extracted from the opening 256.

By hooking the wire member 35 around the wire guide 328, when the substrate retainer 31 is being inserted into the housings, the pulling load is applied to the wire guide 328. Accordingly, pulling load on the connection point between the wire member 35 and the substrate 40 may be reduced, and damages to the connection between the wire member 35 and the substrate 40 may be prevented.

The positioning groove 316 is formed in the side surface 315 of the substrate retainer 31, the side surface 315 facing the sensor unit housing 255. Further, the rib 257 is formed on a surface of the sensor unit housing 255 that faces the substrate retainer 31, the rib 257 being inserted into the positioning groove 316. As a result, the sensor unit 255 and the substrate retainer 31 may be appropriately positioned relative to each other.

Each of the magnetic sensors 45 includes a plurality (in the present embodiment, two) of magnetic detection elements 511, 521, processors 513, 523, and a determination unit 531.

A respective one of the processors 513, 523 is provided for each magnetic detection element 511, 521.

The determination unit 531 performs an abnormality determination based on the calculation results of the processors 513, 523.

In the present embodiment, the magnetic sensors 45 include the processors 513, 523 and the determination units 531, and thus the magnetic sensors 45 themselves may perform the abnormality determination. Further, in the magnetic sensors 45, one of the processors 513, 523 is provided for each of the plurality of magnetic detection elements 511, 521 in a redundant manner. Accordingly, if an abnormality occurs in one of the calculation circuits, the detection value of the normally operating circuit may be used to continue the control process (in the present embodiment, the control process is controlling the electric power steering device 80 based on a detected steering torque).

Further, in the magnetic sensors 45, for each of the processors 513, 523, at least three memory units 515, 516, 517, 525, 526, 527 are provided to store parameters used by a corresponding one of the processors 513, 523 for calculations.

In the present embodiment, the memory units 515, 516, 517, 525, 526, 527 are provided in a redundant manner. In other words, for one of the processors 513, 523, at least three memory units 515, 516, 517, 525, 526, 527 are provided, and the parameter is selected by majority rule to ensure redundancy.

The torque sensor 10 includes the magnetic detection device 1, the torsion bar 13, the multipole magnet 15, and the magnetic yoke 16.

The torsion bar 13 is coaxially connected to the input shaft 11 and the output shaft 12, and converts torque applied between the input shaft 11 and the output shaft 12 into torsional displacement. The multipole magnet 15 is fixed to the input shaft 11 or to one end of the torsion bar 13. The magnetic yoke 16 is fixed to the output shaft 12 or to the other end of the torsion bar 13, and forms a magnetic circuit within the magnetic field generated by the multipole magnet 15.

The first collector ring 21 and the second collector ring 22 collect magnetic flux from the magnetic yoke 16 at the collector portions 215, 225. Accordingly, the magnetic detection device 1 may appropriately detect the torque applied between the input shaft 11 and the output shaft 12.

Second, Third, and Fourth Embodiments

A second, third, and fourth embodiment of the present disclosure are similar to the above described embodiment, except that cutout portions in a substrate have different shapes.

Figure 21:
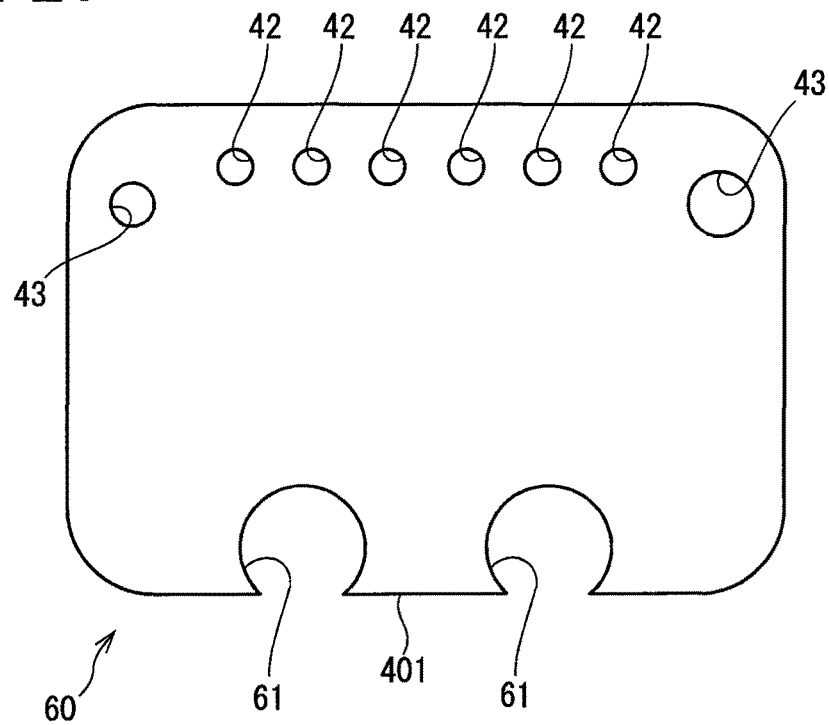
FIG. 21 is a plane view showing a substrate of a second embodiment of the present disclosure.

In the second embodiment shown in FIG. 21, cutout portions 61 of a substrate 60 are circular shaped. Not limited to the example of FIG. 18, cutout portions having a semicircle shape or such may be provided instead.

Figure 22:
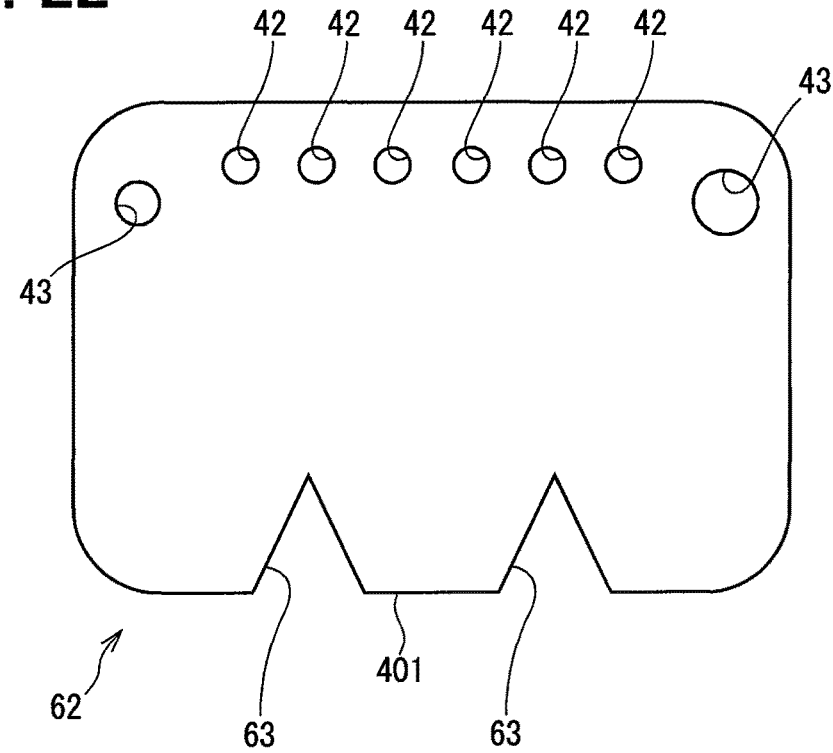
FIG. 22 is a plane view showing a substrate of a third embodiment of the present disclosure.
Figure 23:
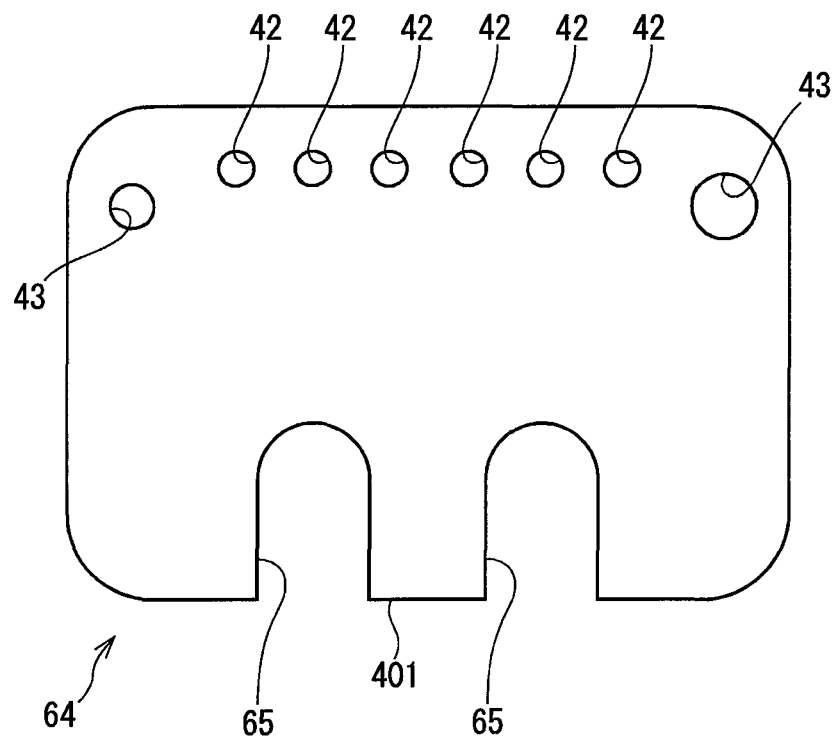
FIG. 23 is a plane view showing a substrate of a fourth embodiment of the present disclosure.

In the third embodiment shown in FIG. 22, cutout portions 63 of a substrate 62 are triangle shaped. Not limited to triangle shapes, polygonal cutout portions may be provided instead.

In the fourth embodiment shown in FIG. 20, cutout portions 65 of a substrate 64 are substantially oval shaped.

In addition, cutout portions of any shape maybe provided, as long as at least a portion of the collector portions 215, 225 may be housed in these cutout portions. Cutout portions formed on the same substrate may also have different shapes from each other. The number of these cutout portions is not limited to two, and may be one, or may be three or more, and are formed in accordance with the number of the magnetic sensors 45. Further, these cutout portions may be concentrated on one side of a substrate as shown in the examples of the first, second, third, and fourth embodiments, but may also be spread out to various sides. Further, when a plurality of cutout portions are spread out over an area, the collector rings 21, 22 are assembled by surrounding both sides of the magnetic sensors 45 as in a fifth embodiment which is described later.

According to such a configuration, at least the same effects as the above described embodiment may be conferred.

Fifth Embodiment

Figure 24:
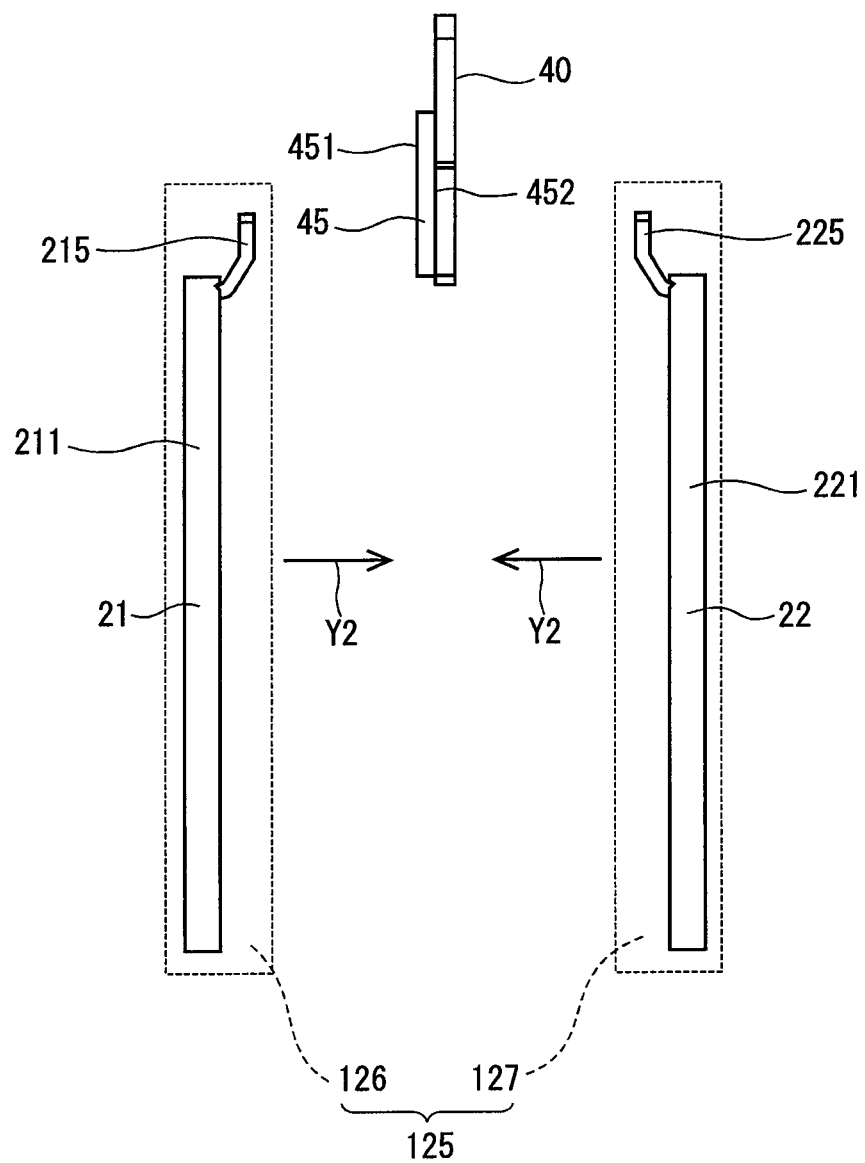
FIG. 24 is a side view that schematically shows a collector ring, a collector ring retainer, and a substrate of a fifth embodiment of the present disclosure.

A fifth embodiment of the present disclosure is shown in FIG. 24. Here, FIG. 24 corresponds to FIG. 11 of the first embodiment. The same applies to FIGS. 25 to 27 which are described later.

As shown in FIG. 24, a collector ring retainer 125 of the present embodiment is formed from a non-magnetic material such as resin, and is divided into a first retainer member 126 and a second retainer member 127. The first collector ring 21 is embedded in the first retainer member 126, and the second collector ring 22 is embedded in the second retainer member 127.

As shown by the arrows Y2 in FIG. 24, in the present embodiment, the first retainer member 126 and the second retainer member 127 are assembled such that the first retainer member 126 approaches toward the front surface 451 of the magnetic sensors 45, while the second retainer member 127 approaches toward the rear surface 452 of the magnetic sensors 45, thereby surrounding the magnetic sensors 45. At that time, similar to the above described embodiments, the collector portions 225 of the second collector ring 22 are positioned in the cutout portions 41 of the substrate 40.

In the present embodiment, the collector ring retainer 125 is divided into the first retainer member 126 that retains the first collector ring 21 and the second retainer member 127 that retains the second collector ring 22.

Accordingly, the collector ring retainer 125 may be assembled to surround the front surface 451 and the rear surface 452 of the magnetic sensor 45.

Further, at least the same effects as the above described embodiment may be conferred.

The present embodiment is explained using the substrate 40 as an example, similar to the first embodiment. However, the present embodiment may use that of the second, third, or fourth embodiments instead. The same applies a sixth, seventh, and eighth embodiment which are described later.

Sixth Embodiment

Figure 25:
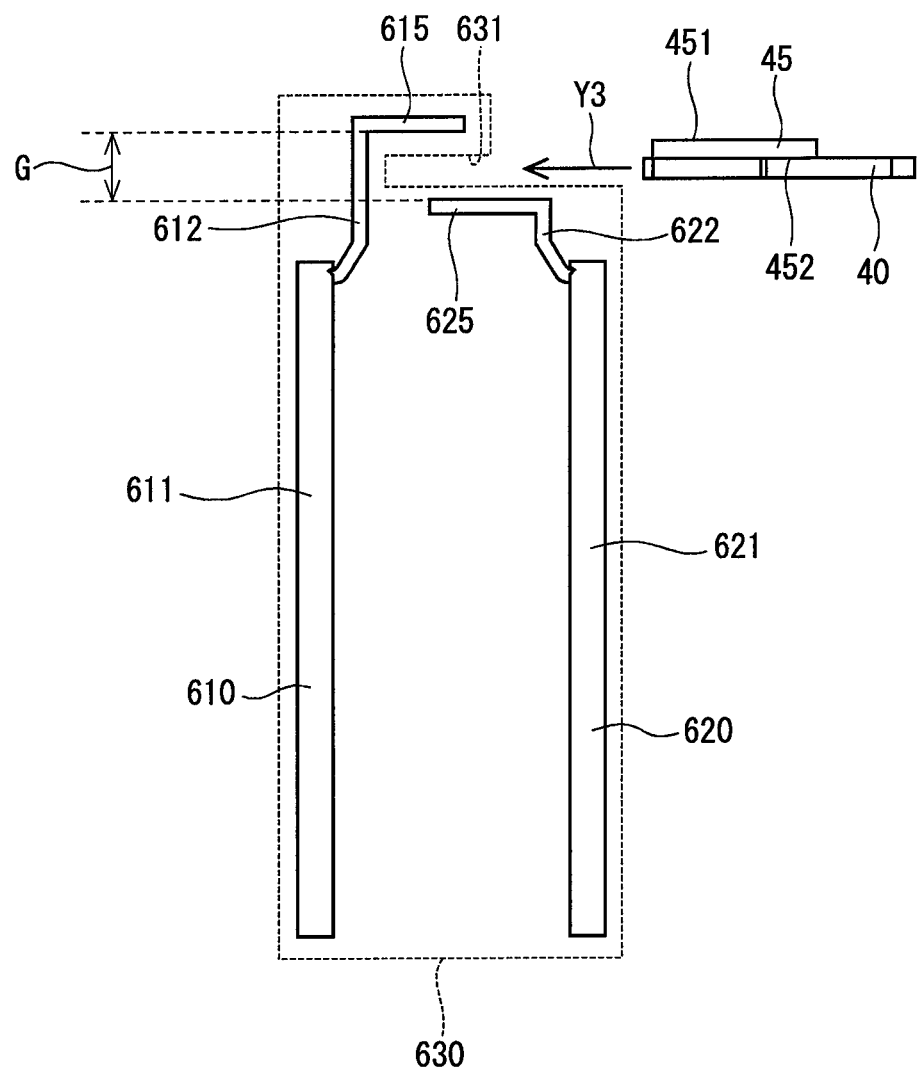
FIG. 25 is a side view that schematically shows a collector ring, a collector ring retainer, and a substrate of a sixth embodiment of the present disclosure.

The sixth embodiment of the present disclosure is shown in FIG. 25.

As shown in FIG. 25, in the present embodiment, the shapes of a first collector ring 610 and a second collector ring 620 are different from the above embodiments. Here, the first collector ring 610 acts as a first magnetic collector, and the second collector ring 620 act as a second magnetic collector. The collector rings 610, 620 are functionally the same as those of the above described embodiments. The same applies to a collector ring 650 which is described later.

The first collector ring 610 includes a ring portion 611, middle portions 612, and collector portions 615. The ring portion 611 is formed of a soft magnetic material, and is substantially ring shaped. The middle portions 612 protrude radially outward from the ring portion 611. The collector portions 615 are bent at the middle portions 612 from a direction away from the ring portion 611 to a direction toward the second collector ring 620. Similar to the above described embodiments, two of the middle portions 612 and the collector portions 615 are provided in the present embodiment.

The first collector ring 620 includes a ring portion 621, middle portions 622, and collector portions 625. The ring portion 621 is formed of a soft magnetic material, and is substantially ring shaped. The middle portions 622 protrude radially outward from the ring portion 621. The collector portions 625 are bent at the middle portions 622 from a direction away from the ring portion 621 to a direction toward the first collector ring 610. Similar to the above described embodiments, two of the middle portions 622 and the collector portions 625 are provided in the present embodiment.

The opposing surfaces of the collector portions 615 of the first collector ring 610 and the collector portions 625 of the second collector ring 620 are substantially parallel to each other. The magnetic sensors 45 are disposed between the collector portions 615 and the collector portions 625. In the present embodiment, the collector portions 615 correspond to a "first collector portion", and the collector portions 625 correspond to a "second collector portion".

A length of the middle portions 612 of the first collector ring 610 is different from a length of the middle portions 622 of the second collector ring 620. In the present embodiment, the length of the middle portions 612 of the first collector ring 610 is longer than the length of the middle portions 622 of the second collector ring 620. Alternatively, the middle portions 622 may be longer than the middle portions 612 instead.

A collector ring retainer 630 integrally retains the collector rings 610, 620. An insertion portion 631 is formed in the collector ring retainer 630, the substrate 40 being inserted into the insertion portion 631. The insertion portion 631 is disposed between the collector portions 615 and the collector portions 625. Further, the insertion portion 631 opens toward the second collector ring 620.

As shown by the arrow Y3, the substrate 40 is inserted from the side of the second collector ring 620, and the magnetic sensor 45 are positioned between the collector portions 615 and the collector portions 625. At this time, similar to the above described embodiments, the collector portion 625 of the second collector ring 620 are positioned in the cutout portions 41 of the substrate 40.

According to such a configuration, at least the same effects as the above described embodiment may be conferred.

Seventh Embodiment

The seventh embodiment of the present disclosure is a modification of the sixth embodiment.

Figure 26:
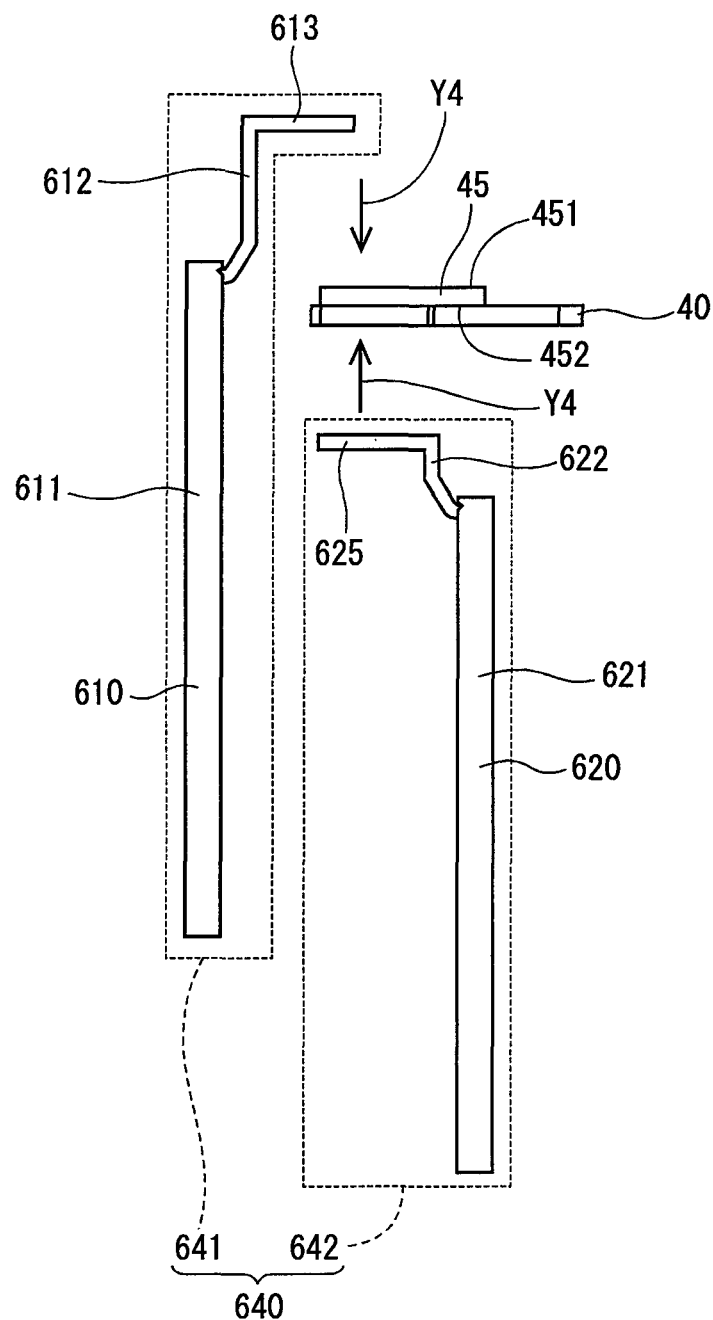
FIG. 26 is a side view that schematically shows a collector ring, a collector ring retainer, and a substrate of a seventh embodiment of the present disclosure.

As shown in FIG. 26, a collector ring retainer 640 of the present embodiment is divided into a first retainer member 641 and a second retainer member 642, similar to the fifth embodiment. The first collector ring 610 is embedded in the first retainer member 641, and the second collector ring 620 is embedded in the second retainer member 642.

In the present embodiment, as shown by the arrows Y4, the collector ring retainer 640 is assembled such that the collector portions 615 approach toward the front surface 451 of the magnetic sensors 45, while the collector portions 625 approach toward the rear surface 452 of the magnetic sensors 45, thereby surrounding the magnetic sensors 45.

According to such a configuration, at least the same effects as the above described embodiment may be conferred.

Eighth Embodiment

Figure 27:
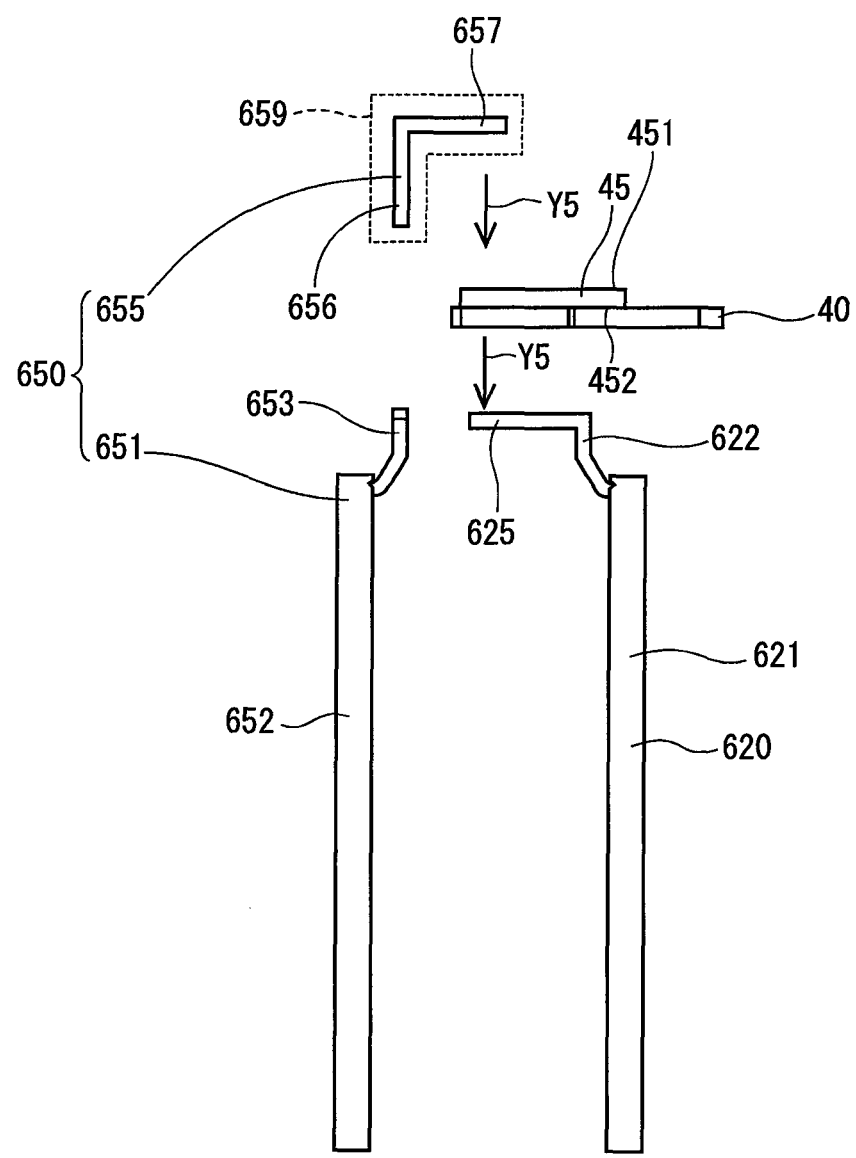
FIG. 27 is a side view that schematically shows a collector ring and a substrate of an eighth embodiment of the present disclosure.

The eighth embodiment of the present disclosure is shown in FIG. 27.

As shown in FIG. 27, a first collector ring 650, which acts as a first magnetic collector of the present embodiment, is split into two parts. Specifically, the first collector ring 650 includes a body portion 651 and split portions 655. The body portion 651 includes a ring portion 652 and protrusion portions 653. The ring portion 652 is substantially ring shaped, and the protrusion portions 653 protrude radially outward from the ring portion 652. In the present embodiment, two of the protrusion portions 653 are provided.

The split portions 655 include connection portions 656 and collector portions 657, and are overall substantially L-shaped. A respective one of the split portions 655 is provided for each of the protrusion portions 653. In other words, in the present embodiment, two of the split portions 655 are provided, and are retained by a split portion retainer 659.

When assembled in the direction shown by the arrows Y5, the connection portions 656 abut the protruding portions 653.

The collector portions 657 are bent from a direction away from the side of the connection portions 656 abutting the protrusion portions 653. When assembled, the opposing surfaces of the collector portions 657 of the first collector ring 650 and the collector portions 625 of the second collector ring 620 are substantially parallel to each other. The magnetic sensors 45 are disposed between the collector portions 657 and the collector portions 625 in a spaced manner to prevent contact.

In FIG. 27, a collector ring retainer is omitted for simplicity, but the body portion 651 of the first collector ring 650, and the second collector ring 620, may be retained in a single retainer member as in the first embodiment, or may be retained in separate retainer members as in the fifth embodiment.

According to such a configuration, at least the same effects as the above described embodiment may be conferred.

Other Embodiments

In the above described embodiments, two magnetic sensors are provided. However, in other embodiments, one magnetic sensor may be provided, or three or more magnetic sensors may be provided. Further, cutout portions in a substrate, first magnetic collectors, and second magnetic collectors are formed according to the number and the positions of magnetic sensors.

Further, in the above described embodiments, each magnetic sensor includes two magnetic detection elements. However, in other embodiments, the number of magnetic detection elements provided for each magnetic sensor may be one, or may be three or more. Further, a processor is preferably provided for each magnetic detection element, but any number of processors may be provided.

In the above described embodiments, three memory units are provided for one processor. However, in other embodiments, the number of memory units provided for each process may be one, or two, or four or more. Further, a common memory unit may be provided for a plurality of processors.

Further, as long as magnetic sensors include a magnetic detection element and an output unit, one or more of a processor, a memory unit, an A/D converter, a D/A converter, and a determination unit may be omitted.

In the first embodiment, a rib is formed on an inner wall of a sensor unit housing, and a positioning groove is formed on a side wall of a substrate retainer. However, in other embodiments, a positioning groove may be formed in a sensor unit housing, and a rib may be formed in a substrate retainer. Further, a rib and a positioning groove are not limited to extending in an insertion direction of a sensor unit, and may be formed in any matter.

In a torque sensor according to the above described embodiments, a first shaft in an input shaft and a second shaft is an output shaft. However, in other embodiments, a first shaft may be an output shaft and a second shaft may be an input shaft instead. In other words, a multipole magnet may be disposed on an output shaft, and a magnetic yoke may be disposed on an input shaft instead.

In the above described embodiments, a magnetic detection device is included in a torque sensor. However, in other embodiments, a magnetic detection device may be applied to devices other than a torque sensor. Further, in the above described embodiments, a torque sensor is applied to an electric power steering device and detects a steering torque. However, in other embodiments, a torque sensor may be applied to devices other than an electric power steering device.

The present disclosure is not limited to the above described embodiments, and a variety of embodiments which do not depart from the gist of the present disclosure are contemplated.

The invention claimed is:

1. A magnetic detection device, comprising: a first magnetic collector that includes a first collector portion; a second magnetic collector that includes a second collector portion, the second collector portion facing the first collector portion from a fixed distance away; a substrate having an outer edge, a cutout portion being formed in the substrate and opening at the outer edge; and a plurality of magnetic sensors, a particular magnetic sensor of the plurality of magnetic sensors including a magnetic detection element, a mold section, and a terminal, the plurality of magnetic sensors being surface mounted on a same side of the substrate such that at least a portion of the mold section of the particular magnetic sensor overlaps the cutout portion, wherein the magnetic detection element detects a magnetic field formed by the first collector portion and the second collector portion, the mold section encapsulates the magnetic detection element, the terminal protrudes from the mold section and is connected to the substrate, the first collector portion is positioned to face a front surface of the particular magnetic sensor, the front surface facing away from the substrate, at least a portion of the second collector portion is positioned in the cutout portion to face a rear surface of the particular magnetic sensor, the rear surface facing toward the substrate, a first air gap is disposed between the first collector portion and the front surface of the particular magnetic sensor, and a second air gap is disposed between the second collector portion and the rear surface of the particular magnetic sensor.

2. The magnetic detection device of claim 1, wherein when viewed from the front surface or the rear surface, the magnetic detection element is positioned in an area overlapping with the first collector portion and the second collector portion.

3. The magnetic detection device of claim 1, wherein the terminal protrudes from an edge of the mold section, the edge being positioned outward of the cutout portion.

4. The magnetic detection device of claim 1, further comprising:
a magnetic collector retainer that retains the first magnetic collector and the second magnetic collector.

5. The magnetic detection device of claim 4, wherein
the magnetic collector retainer integrally retains the first magnetic collector and the second magnetic collector.

6. The magnetic detection device of claim 4, wherein
the magnetic collector retainer is divided into a first retainer member that retains the first magnetic collector and a second retainer member that retains the second magnetic collector.

7. The magnetic detection device of claim 4, further comprising:
a substrate retainer that retains the substrate, wherein
the magnetic collector retainer includes a housing that houses the substrate retainer.

8. The magnetic detection device of claim 7, wherein
the housing is disposed outside of the first magnetic collector and the second magnetic collector,
an opening is formed in the housing, the opening being formed to open away from the first magnetic collector and the second magnetic collector, and
the magnetic retainer is inserted into the housing from the opening.

9. The magnetic detection device of claim 8, further comprising:
a wire member that includes a substrate connector connected to the substrate, the wire member connecting the substrate to an other device, wherein
the wire member is hooked around a wire guide that is positioned farther away from the opening than the substrate connector is from the opening, and
an end of the wire member opposite from the substrate connector is extracted from the opening.

10. The magnetic detection device of claim 7, wherein
a positioning groove is formed on one of a surface of the housing facing the substrate retainer and a surface of the substrate retainer facing the housing,
a rib is formed on an other of the surface of the housing facing the substrate retainer and the surface of the substrate retainer facing the housing, and
the rib is inserted into the positioning groove.

11. The magnetic detection device of claim 7, wherein
the housing is configured to open away from the first collector portion and the second collector portion.

12. The magnetic detection device of claim 7, the housing further comprising:
an opening that is positioned on an end of the housing that is opposite the first collector portion and the second collector portion, wherein the housing is configured to receive the substrate retainer through the opening.

13. The magnetic detection device of claim 1, wherein
the particular magnetic sensor includes a plurality of the magnetic detection element, processors, and a determination unit,
a respective one of the processors is provided for each of the plurality of magnetic detection elements, and
the determination unit performs an abnormality determination based on a calculation result of the processors.

14. The magnetic detection device of claim 13, wherein
at least three memory units are provided in the particular magnetic sensor for each of the processors, the memory units storing parameters used by a corresponding one of the processors for calculations.

15. A torque sensor, comprising:
the magnetic detection device according to claim 1;
a torsion bar coaxially connected to a first shaft and a second shaft, the torsion bar converting a torque applied between the first shaft and the second shaft into torsional displacement;
a multipole magnet fixed to the first shaft or one end of the torsion bar; and
a magnetic yoke fixed to the second shaft or an other end of the torsion bar, wherein
the magnetic yoke forms a magnetic circuit within a magnetic field generated by the multipole magnet, and
the first magnetic collector and the second magnetic collector collect magnetic flux from the magnetic yoke at the first collector portion and the second collector portion.

16. The magnetic detection device of claim 1, wherein
the substrate and the plurality of magnetic sensors are free of a surrounding resin housing such that the cutout portion of the substrate is able to receive at least a portion of the second collector portion.

17. The magnetic detection device of claim 1, wherein the first air gap is defined by the first collector portion and the front surface of the particular magnetic sensor, and the second air gap is defined by the second collector portion and the rear surface of the particular magnetic sensor.

* * * * *